(12) United States Patent
Lee et al.

(10) Patent No.: US 10,719,160 B2
(45) Date of Patent: Jul. 21, 2020

(54) DISPLAY DEVICE

(71) Applicant: Samsung Display Co., Ltd., Yongin-si (KR)

(72) Inventors: Tae Hee Lee, Hwaseong-si (KR); Sung Kook Park, Suwon-si (KR); So Hee Park, Cheonan-si (KR); Hee Seomoon, Hwaseong-si (KR); Won Ki Hong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/210,280

(22) Filed: Dec. 5, 2018

(65) Prior Publication Data

US 2020/0042131 A1 Feb. 6, 2020

(30) Foreign Application Priority Data

Jul. 31, 2018 (KR) .................... 10-2018-0089449

(51) Int. Cl.
*G06F 3/041* (2006.01)
*G06F 1/16* (2006.01)
(Continued)

(52) U.S. Cl.
CPC .......... *G06F 3/0414* (2013.01); *G06F 1/1601* (2013.01); *G06F 3/045* (2013.01);
(Continued)

(58) Field of Classification Search
CPC .... G06F 1/1692; G06F 1/1601; G06F 3/0414; G06F 3/045; G06F 2203/04103;
(Continued)

(56) References Cited

U.S. PATENT DOCUMENTS 9,274,660 B2   3/2016 Bernstein et al.
2011/0148811 A1* 6/2011 Kanehira ............... G06F 3/044
                                                         345/174
(Continued)

FOREIGN PATENT DOCUMENTS

EP        3579089        12/2019
KR    10-2016-0149982    12/2016
(Continued)

OTHER PUBLICATIONS

Extended European Search Report dated Jul. 19, 2019, in European Patent Application No. 19161794.3.
(Continued)

*Primary Examiner* — Richard J Hong

(74) *Attorney, Agent, or Firm* — H.C. Park & Associates, PLC

(57) ABSTRACT

A display device includes a bracket, a display panel, a first force sensor, and a main circuit board. The display panel is disposed on the bracket. The first force sensor is disposed between the display panel and the bracket, the first force sensor being adjacent to a first edge of the display panel. The main circuit board is disposed below the bracket such that the bracket is disposed between the display panel and the main circuit board. The bracket includes a first hole exposing the main circuit board. The first force sensor is connected to the main circuit board through the first hole.

22 Claims, 28 Drawing Sheets

(51) Int. Cl.
  *G06F 3/045* (2006.01)
  *H05K 1/18* (2006.01)
(52) U.S. Cl.
  CPC ... *H05K 1/189* (2013.01); *G06F 2203/04103* (2013.01); *H05K 2201/095* (2013.01); *H05K 2201/10128* (2013.01)
(58) Field of Classification Search
  CPC ........ G06F 3/0488; G06F 3/044; G06F 3/016; H05K 1/189; H05K 2201/095; H05K 2201/10128; H01Q 1/243
  See application file for complete search history.

(56) References Cited

U.S. PATENT DOCUMENTS

| | | | |
|---|---|---|---|
| 2013/0155627 A1 | 6/2013 | Mareno et al. | |
| 2014/0253305 A1* | 9/2014 | Rosenberg | G06F 3/016 340/407.2 |
| 2015/0123857 A1* | 5/2015 | Park | H01Q 1/243 343/702 |
| 2016/0062517 A1 | 3/2016 | Meyer et al. | |
| 2016/0103544 A1* | 4/2016 | Filiz | G06F 3/0414 345/174 |
| 2017/0177160 A1 | 6/2017 | Oh et al. | |
| 2017/0336899 A1* | 11/2017 | Szeto | G06F 1/1692 |
| 2018/0017999 A1 | 1/2018 | Kim et al. | |
| 2018/0143669 A1 | 5/2018 | Bok et al. | |
| 2018/0166507 A1 | 6/2018 | Hwang et al. | |
| 2018/0181163 A1 | 6/2018 | Shin et al. | |
| 2018/0188874 A1 | 7/2018 | Cho et al. | |
| 2018/0210598 A1* | 7/2018 | Lu | G06F 3/0414 |
| 2018/0219985 A1* | 8/2018 | Shin | G06F 3/0414 |
| 2018/0224963 A1* | 8/2018 | Lee | G06F 3/0488 |

FOREIGN PATENT DOCUMENTS

| | | |
|---|---|---|
| KR | 10-2018-0005833 | 1/2018 |
| KR | 10-2018-0008945 | 1/2018 |

OTHER PUBLICATIONS

S.J. Dempsey et al., "Tactile sensing in human-computer interfaces: The inclusion of pressure sensitivity as a third dimension of user input," Sensors and Actuators A: Physical, vol. 232, Aug. 1, 2015, pp. 229-250, vol. 232, Elsevier, B.V.

Office Action dated May 15, 2020, in European Patent Application No. 19161794.3.

* cited by examiner

DISPLAY DEVICE

CROSS-REFERENCE TO RELATED APPLICATION

This application claims priority from and the benefit of Korean Patent Application No. 10-2018-0089449, filed Jul. 31, 2018, which is hereby incorporated by reference for all purposes as if fully set forth herein.

BACKGROUND

Field

Exemplary embodiments generally relate to a display device, and, more particularly, to a display device including one or more force sensors.

Discussion

Electronic devices that provide images to a user, such as a smartphone, a tablet personal computer (PC), a digital camera, a notebook computer, a navigation system, a smart television, and the like, include a display device for displaying images. The display device typically includes a display panel that generates and displays an image, as well as may include various input devices. For instance, a touch panel that recognizes a touch input may be applied to a display device, such as in association with a smartphone and a tablet PC. Due to the convenience of a touch method, the touch panel may replace existing physical input devices, such as a keypad. Research is also being conducted in association with including force sensors in a display device and utilizing the force sensors in place of existing physical buttons.

The above information disclosed in this section is only for understanding the background of the inventive concepts, and, therefore, may contain information that does not form prior art.

SUMMARY

Some exemplary embodiments are capable of providing a display device including force sensors that enable relatively easy input.

Additional aspects will be set forth in the detailed description which follows, and, in part, will be apparent from the disclosure, or may be learned by practice of the inventive concepts.

According to some exemplary embodiments, a display device includes a bracket, a display panel, a first force sensor, and a main circuit board. The display panel is disposed on the bracket. The first force sensor is disposed between the display panel and the bracket, the first force sensor being adjacent to a first edge of the display panel. The main circuit board is disposed below the bracket such that the bracket is disposed between the display panel and the main circuit board. The bracket includes a first hole exposing the main circuit board. The first force sensor is connected to the main circuit board through the first hole.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
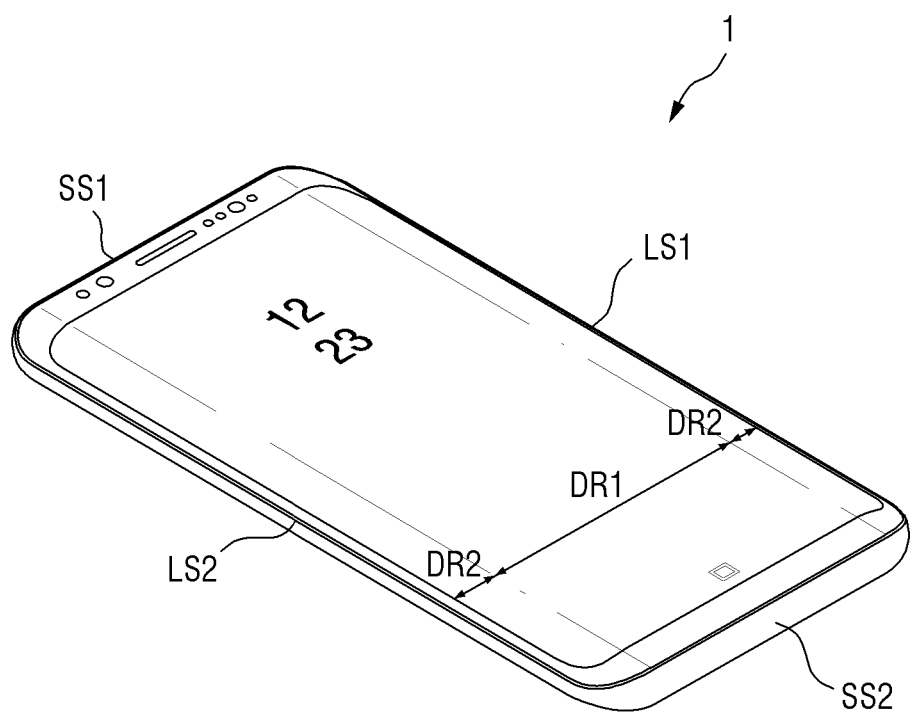
FIG. 1 is a perspective view of a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalties between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to cross-sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Figure 2:
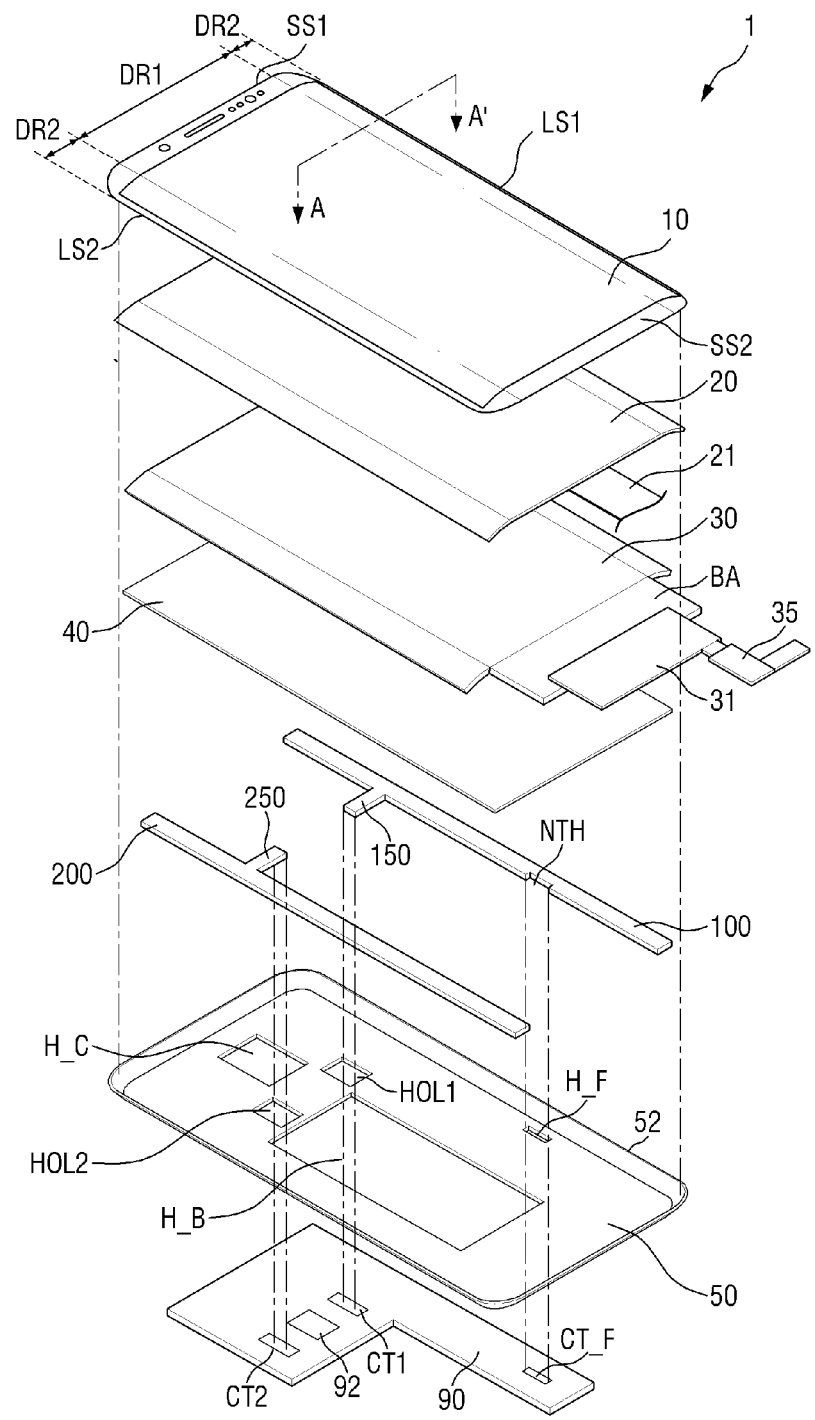
FIG. 2 is an exploded perspective view of an example of the display device of FIG. 1 according to some exemplary embodiments.
Figure 3:
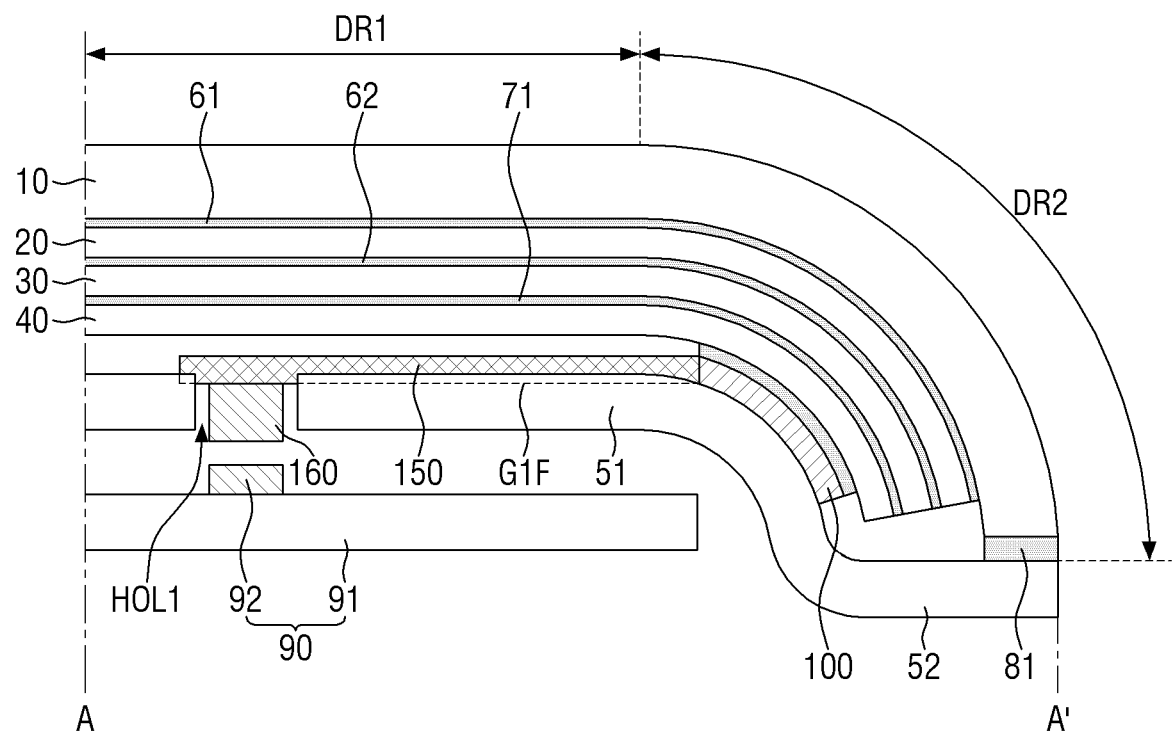
FIG. 3 is a cross-sectional view of an example of the display device taken along sectional line A-A' of FIG. 2 according to some exemplary embodiments.
Figure 4:
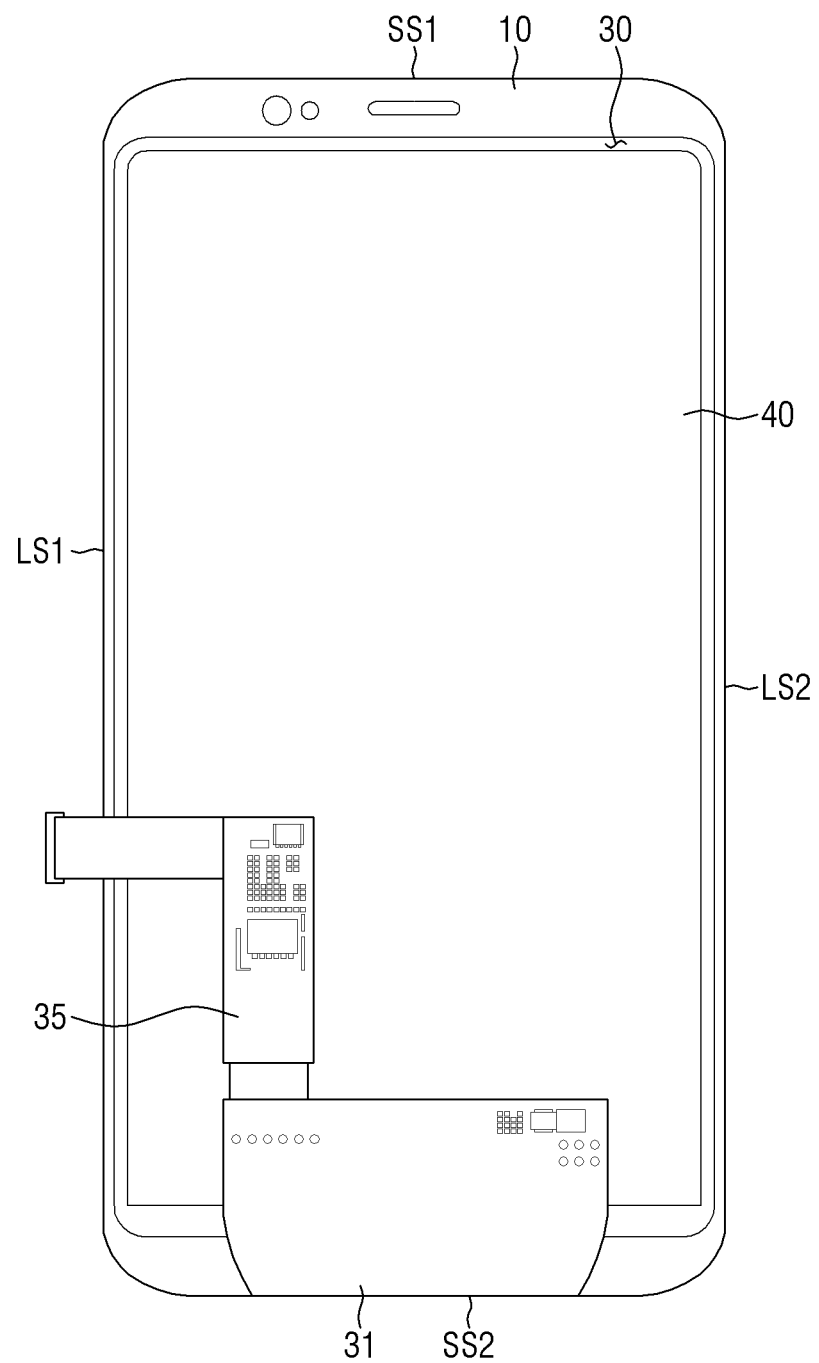
FIG. 4 is a bottom view of an example of a display panel included in the display device of FIG. 2 according to some exemplary embodiments.

Hereinafter, various exemplary embodiments will be explained in detail with reference to the accompanying drawings FIG. 1 is a perspective view of a display device according to some exemplary embodiments. FIG. 2 is an exploded perspective view of an example of the display device of FIG. 1 according to some exemplary embodiments. FIG. 3 is a cross-sectional view of an example of the display device of FIG. 1 taken along sectional line A-A' of FIG. 2 according to some exemplary embodiments. FIG. 4 is a bottom view of an example of a display panel included in the display device of FIG. 2 according to some exemplary embodiments.

Referring to FIG. 1, a display device 1 may have a substantially rectangular shape in plan view. The display device 1 may be shaped like a rectangle with right-angled corners or a rectangle with round corners in a plan view; however, exemplary embodiments are not limited thereto. The display device 1 may include both long sides LS1 and LS2 and both short sides SS1 and SS2. In the rectangular display device 1 or members, such as a display panel 30 included in the rectangular display device 1, a long side located on a right side in plan view will be referred to as a first long side LS1, a long side located on a left side in plan view will be referred to as a second long side LS2, a short side located on an upper side in plan view will be referred to as a first short side SS1, and a short side located on a lower side in plan view will be referred to as a second short side SS2. The long sides LS1 and LS2 of the display device 1 may be, but are not limited to, about 1.5 to 2.5 times longer than the short sides SS1 and SS2.

Unless otherwise defined, the terms "above" and "upper surface" in a thickness direction, as used herein, denote a display surface side of the display panel 30, and the terms "below" and "lower surface" in the thickness direction, as used herein, denote an opposite side of the display panel 30 from the display surface side. In addition, the terms "above (upper)," "below (lower)," "left," and "right" in a planar direction refer to directions when a display surface placed in position is viewed from above, e.g., in a plan view.

The display device 1 may include a first area DR1 and a second area DR2 lying in different planes. The first area DR1 lies in a first plane. The second area DR2 is connected to the first area DR1, but is bent or curved from the first area DR1. The second area DR2 may lie in a second plane located at a predetermined crossing angle to the first plane or may have a curved surface. The second area DR2 of the display device 1 may be disposed around (or adjacent to) the first area DR1. The first area DR1 of the display device 1 may be used as a main display surface. The second area DR2, as well as the first area DR1 may be used as a display area of the display device 1. A case where the first area DR1 of the display device 1 is a flat portion and the second area DR2 is a curved portion will be described below as an example.

The second area DR2, which is the curved portion, may have a constant curvature or a varying curvature. The second area DR2 may be disposed at edges of the display device 1. In some exemplary embodiments, the second area DR2 may be disposed at both long edges (long sides LS1 and LS2) of the display device 1 that face each other. In some exemplary embodiments, the second area DR2 may be disposed at one edge, at both short edges (short sides SS1 and SS2), at three edges, or at all edges of the display device 1.

Referring to FIGS. 2 and 3, the display device 1 includes the display panel 30 and force sensors 100 and 200 disposed near edges of the display panel 30. The display device 1 may further include a window 10 disposed above the display panel 30, a cover panel sheet 40 disposed below the display panel 30, and a bracket 50 (or a middle frame or a middle mold frame) disposed below the cover panel sheet 40.

The display panel 30 is a panel for displaying a screen and may be, for example, an organic light emitting display panel. For descriptive and illustrative convenience, a case where an organic light emitting display panel is applied as the display panel 30 will be described as an example. However, other types of display panels, such as a liquid crystal display panel, an electrophoretic display panel, etc., may be applied as display panel 30. A display flexible circuit board 31 may be coupled to the display panel 30.

The display panel 30 includes a plurality of organic light emitting elements disposed on a substrate. The substrate may be a rigid substrate made of glass, quartz, or the like, or may be a flexible substrate made of, for example, polyimide or other polymer resins. When a polyimide substrate is applied as the substrate, the display panel 30 can be bent, curved, folded, rolled, and/or the like. For example, as illustrated in FIG. 2, the display panel 30 may include a bending area BA disposed at the second short side SS2 and may be bent. The display flexible circuit board 31 may be attached to the bending area BA of the display panel 30. The display flexible circuit board 31 may include a display connector 35 formed at an end. As illustrated in FIG. 4, the display flexible circuit board 31 may be placed on a lower surface of the display panel 30 by bending of the bending area BA (or bending of the display flexible circuit board 31).

The window 10 is disposed above the display panel 30. The window 10 is disposed above the display panel 30 to protect the display panel 30 and transmit light emitted from the display panel 30. The window 10 may be made of glass or transparent plastic; however, exemplary embodiments are not limited thereto.

The window 10 may be disposed to overlap the display panel 30 and cover the entire surface of the display panel 30. The window 10 may be larger than the display panel 30. For example, the window 10 may protrude outward from the display panel 30 at both short sides SS1 and SS2 of the display device 1. The window 10 may also protrude from the display panel 30 at both long sides LS1 and LS2 of the display device 1. However, the protruding distance of the window 10 may greater at both short sides SS1 and SS2.

In some exemplary embodiments, the display device 1 may further include a touch member 20 disposed between the display panel 30 and the window 10. The touch member 20 may be of a rigid panel type, a flexible panel type, or a film type. The touch member 20 may have substantially the same size as the display panel 30 and may overlap the display panel 30. Side surfaces of the touch member 20 may be, but are not necessarily, aligned with side surfaces of the display panel 30 at all sides excluding the bent, second short side SS2 of the display panel 30. The display panel 30 and the touch member 20, and the touch member 20 and the window 10 may be bonded together by transparent bonding layers 62 and 61, such as optically clear adhesives (OCA) or optically clear resins (OCR), respectively. A touch flexible circuit board 21 may be coupled to the touch member 20.

The touch member 20 can be omitted. In this case, the display panel 30 and the window 10 may be bonded together by an OCA or an OCR. In some exemplary embodiments, the display panel 30 may include a touch electrode portion.

The cover panel sheet 40 is disposed below the display panel 30. The cover panel sheet 40 may be attached to the lower surface of the display panel 30 by a bonding layer 71, such as a pressure-sensitive adhesive (PSA) layer or an adhesive layer.

The cover panel sheet 40 is disposed to overlap a central portion of the display panel 30. The cover panel sheet 40 may have a size substantially similar to that of the display panel 30. In FIGS. 2 and 3, the cover panel sheet 40 is illustrated as having the same size as the display panel 30. However, this is merely an example, and the cover panel sheet 40 is not limited to this example. For example, the cover panel sheet 40 may expose the lower surface of the display panel 30 by a predetermined width in the vicinity of both long sides LS1 and LS2 of the display panel 30. In this case, the force sensors 100 and 200 may be disposed on the exposed lower surface of the display panel 30.

The cover panel sheet 40 may perform a heat dissipating function, an electromagnetic wave shielding function, a pattern detection preventing function, a grounding function, a buffering function, a strength enhancing function, and/or a digitizing function. The cover panel sheet 40 may include a functional layer having at least one of the aforementioned functions. The functional layer may be provided in various forms, such as at least one of a layer, a membrane, a film, a sheet, a plate, and a panel. The cover panel sheet 40 may include one functional layer or a plurality of functional layers. For example, the cover panel sheet 40 may include a buffer sheet, a graphite sheet, and a copper sheet stacked sequentially from, for instance, top to bottom.

The force sensors 100 and 200 may be disposed to overlap at least one edge of the cover panel sheet 40 (or the display panel 30). A plurality of force sensors 100 and 200 may be provided. As illustrated in the drawings, the force sensors 100 and 200 may include a first force sensor 100 overlapping a first long edge (e.g., first long side LS1) of the display panel 30 and a second force sensor 200 overlapping a second long edge (e.g., second long side LS2) of the display panel 30. The first and second force sensors 100 and 200 may be disposed in the second area DR2 (e.g., the curved portion) of the display device 1. However, the first and second force sensors 100 and 200 are not necessarily disposed in the second area DR2.

The first and second force sensors 100 and 200 may be disposed in the second area DR2 of the display device 1 and may not be disposed in the first area DR1. However, exemplary embodiments are not limited to this case, and the first and second force sensors 100 and 200 may also be disposed in the second area DR2 and extended in a width direction to a part of the first area DR1.

Although the first and second force sensors 100 and 200 are overlapped by the display panel 30, an area of the display panel 30 which overlaps the first and second force sensors 100 and 200 may be, in some exemplary embodiments, a non-display area around the display area. An outermost black matrix may be disposed in the non-display area of the display panel 30 around the display area. In addition, although the first and second force sensors 100 and 200 are overlapped by the touch member 20, an area of the touch member 20 that overlaps the first and second force sensors 100 and 200 may be a peripheral area where a touch electrode is not disposed.

In some exemplary embodiments, the first and second force sensors 100 and 200 may further include first and second sensing flexible circuit boards 150 and 250, respectively. The first and second sensing flexible circuit boards 150 and 250 may connect the first and second force sensors 100 and 200 to a main circuit board 90, which will be described later, and transmit driving signals (or sensing signals) between the first and second force sensors 100 and 200 and the main circuit board 90. Each of the first and second sensing flexible circuit boards 150 and 250 may include a first sensing connector 160 formed or disposed at an end, and may be coupled to the main circuit board 90 by the first sensing connector 160. More specific configurations of the first and second force sensors 100 and 200 will be described later with reference to FIGS. 5 through 10.

The bracket 50 is disposed below the first and second force sensors 100 and 200 and the cover panel sheet 40. The bracket 50 may be a storage container or a protective container for housing other components. For example, the bracket 50 may house the window 10, the touch member 20, the display panel 30, the first and second force sensors 100 and 200, and the cover panel sheet 40.

The bracket 50 may include a bottom portion 51 and sidewalls 52 extending from sides of the bottom portion 51.

The bottom portion 51 of the bracket 50 faces the first and second force sensors 100 and 200 and the cover panel sheet 40. The first and second force sensors 100 and 200 and the cover panel sheet 40 may be attached to the bottom portion 51 of the bracket 50 by bonding layers (not illustrated), such as pressure-sensitive adhesive layers or adhesive layers, respectively. In some exemplary embodiments, the bonding layers, which attach the first and second force sensors 100 and 200 to the bottom portion 51 of the bracket 50, may be waterproof tapes.

The sidewalls 52 of the bracket 50 face side surfaces of the touch member 20, the display panel 30, the first and second force sensors 100 and 200, and the cover panel sheet 40. Upper ends of the sidewalls 52 of the bracket 50 face the window 10. An outer surface of the bracket 50 may be aligned with an outer surface of the window 10. The window 10 may be attached to the bracket 50 with a waterproof tape 81.

The bracket 50 may include a connect hole H_F, through which a display connector 35 passes, near the first long edge (e.g., first long side LS1). The connect hole H_F may penetrate the bottom portion 51 of the bracket 50 in the thickness direction and may have a slit shape. The first force sensor 100 may have a notch-shaped recess NTH near the connect hole H_F of the bracket 50.

In addition, the bracket 50 may include first and second through holes HOL1 and HOL2 overlapping the first and second sensing flexible circuit boards 150 and 250 of the first and second force sensors 100 and 200. The first and second through holes HOL1 and HOL2 may penetrate the bottom portion 51 of the bracket 50 in the thickness direction and may have a quadrilateral shape (or a slit shape). The first through hole HOL1 may overlap an end of the first sensing flexible circuit board 150 of the first force sensor 100. In this case, a first sensing connector 160 formed at the end of the first sensing flexible circuit board 150 may penetrate the bracket 50 through the first through hole HOL1. Similarly, the second through hole HOL2 may overlap an end of the second sensing flexible circuit board 250 of the second force sensor 200. In this case, a second force connector (not illustrated) formed at the end of the second sensing flexible circuit board 250 may penetrate the bracket 50 through the second through hole HOL2.

In some exemplary embodiments, the bracket 50 may include grooves overlapping the first and second force sensors 100 and 200. As illustrated in FIG. 3, the bracket 50 may include a first guide groove G1F formed to correspond to the first sensing flexible circuit board 150 of the first force sensor 100, and the first sensing flexible circuit board 150 may be disposed in the first guide groove G1F of the bracket 50.

For reference, in FIG. 2, the window 10, the touch member 20, the display panel 30, and the cover panel sheet 40 may be manufactured as a first structure, and the first and second force sensors 100 and 200, the bracket 50, and the main circuit board 90 may be manufactured as a second structure (for example, an under-panel structure). Then, the display device 1 may be manufactured by coupling the first structure and the second structure together. When the bracket 50 includes the first and second through holes HOL1 and HOL2 and the grooves (e.g., the first guide groove G1F), the first and second force sensors 100 and 200 can be easily aligned and coupled to the bracket 50.

In addition, the bracket 50 may further include a sensor hole H_C and a battery hole H_B. Each of the sensor hole H_C and the battery hole H_B may penetrate the bracket 50. When the display device 1 includes a sensor, such as a camera device, the camera device may be disposed to correspond to the sensor hole H_C. Similarly, when the display device 1 includes a battery device, the battery device may be disposed in the battery hole H_B.

The main circuit board 90 may be disposed below the bracket 50 and may include a first connection terminal CT1, a second connection terminal CT2, a main connection terminal CT_F, and a main processor 92.

The first connection terminal CT1 may overlap the first through hole HOL1 and may be connected to the end of the first sensing flexible circuit board 150 passing through the first through hole HOL1. The second connection terminal CT2 may overlap the second through hole HOL2 and may be connected to the end of the second sensing flexible circuit board 250 passing through the second through hole HOL2. The main connection terminal CT_F may be connected to the display connector 35 of the display flexible circuit board 31 passing through the connect hole H_F.

The main processor 92 may control all the functions of the display device 1. The specific configuration of the main circuit board 90 will be described later with reference to FIGS. 22 and 23.

The first and second force sensors 100 and 200, the bracket 50, and the main circuit board 90 will now be sequentially described in more detail. The second force sensor 200 is substantially the same as or similar to the first force sensor 100, except for the notch-shaped recess NTH. Therefore, the first and second force sensors 100 and 200 will be described based on the first force sensor 100.

Figure 5:
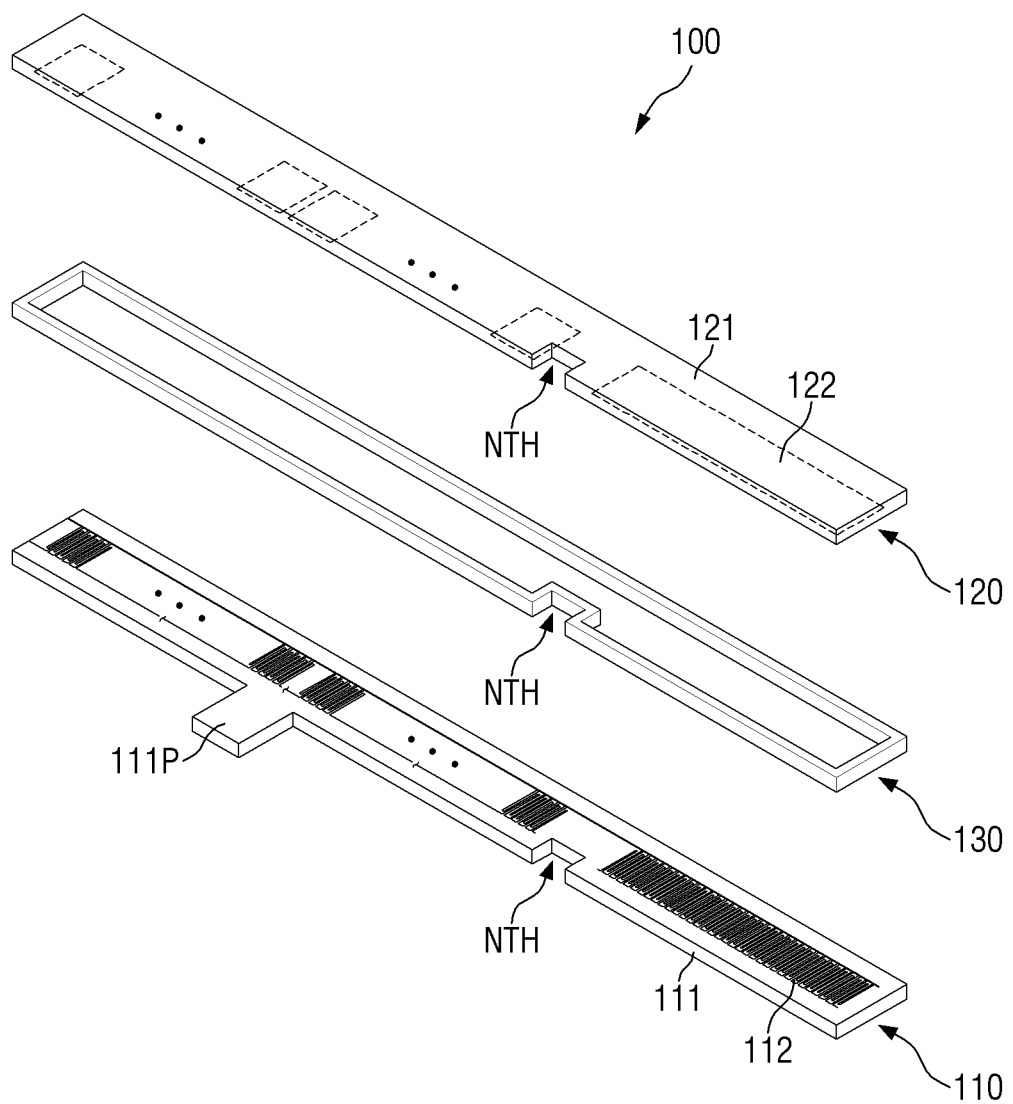
FIG. 5 is an exploded perspective view of an example of a force sensor included in the display device of FIG. 2 according to some exemplary embodiments.
Figure 6:
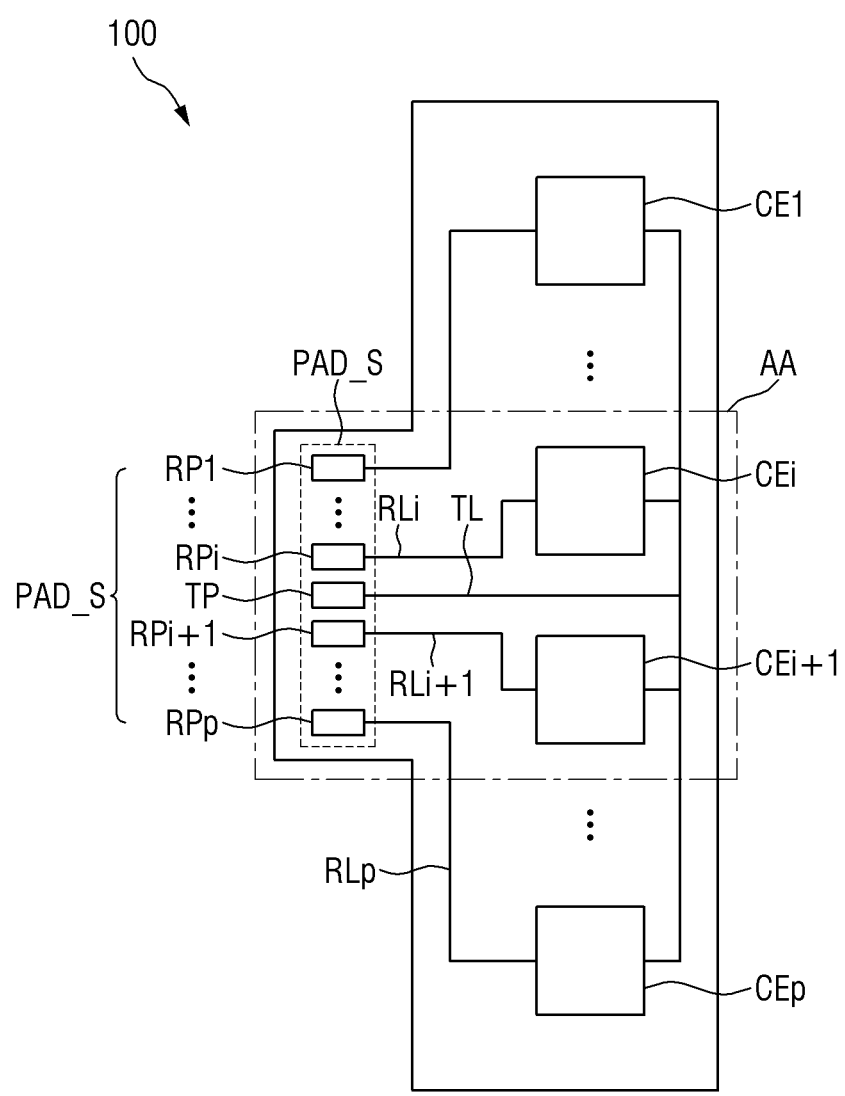
FIG. 6 is a circuit diagram of an example of the force sensor of FIG. 5 according to some exemplary embodiments.
Figure 7:
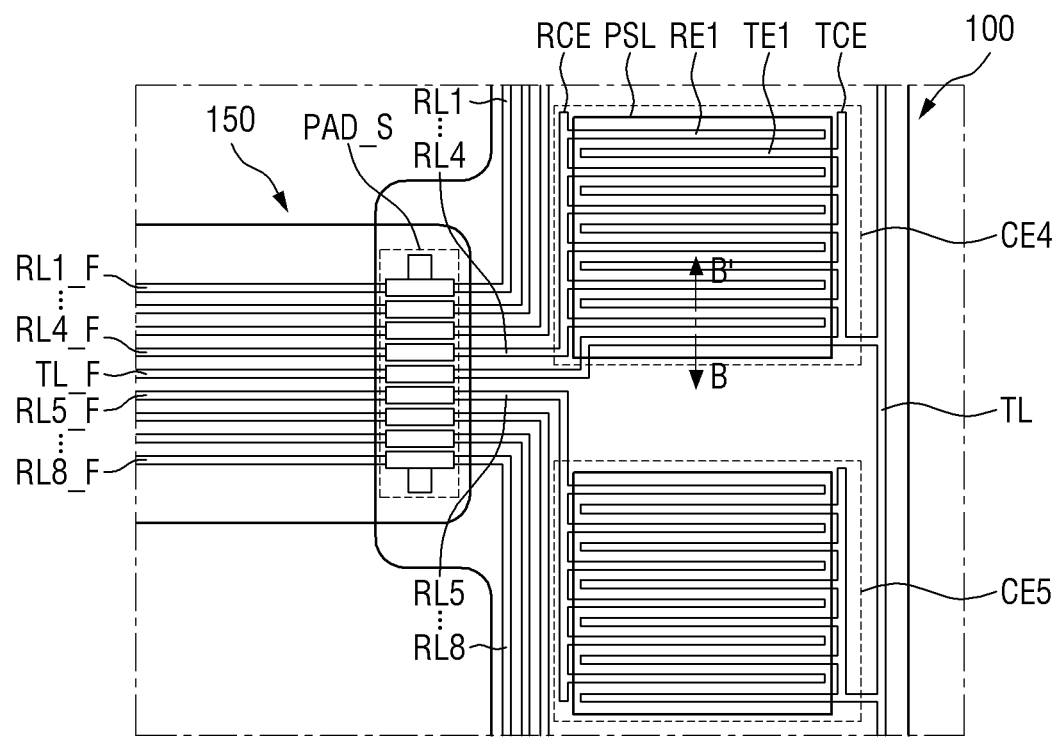
FIG. 7 is an enlarged layout view of an area AA of FIG. 6 according to some exemplary embodiments.
Figure 8:
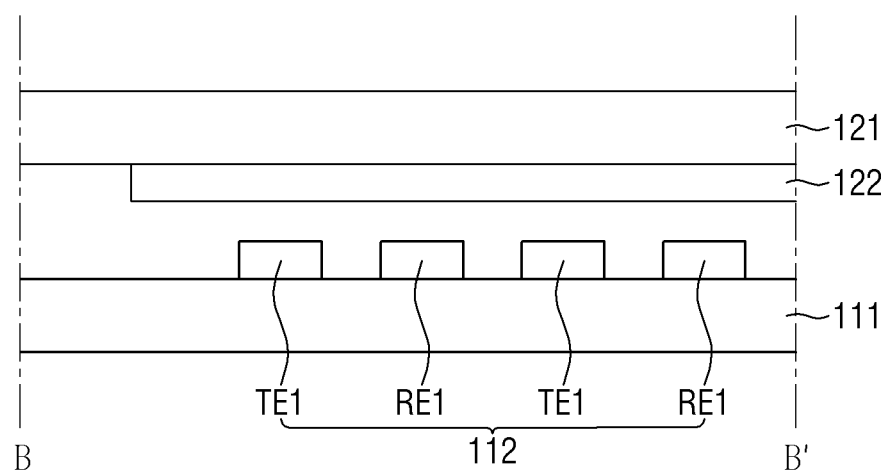
FIG. 8 is a cross-sectional view of an example of the force sensor taken along sectional line B-B' of FIG. 7 according to some exemplary embodiments.
Figure 9:
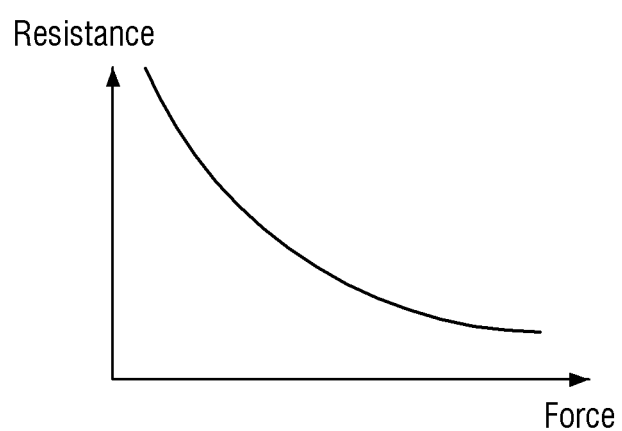
FIG. 9 is a graph illustrating the electrical resistance to force of a force sensing layer included in the force sensor of FIG. 7 according to some exemplary embodiments.

FIG. 5 is an exploded perspective view of an example of a force sensor included in the display device of FIG. 2 according to some exemplary embodiments. FIG. 6 is a circuit diagram of an example of the force sensor of FIG. 5 according to some exemplary embodiments. FIG. 7 is an enlarged layout view of an area AA of FIG. 6 according to some exemplary embodiments. FIG. 8 is a cross-sectional view of an example of the force sensor taken along sectional line B-B' of FIG. 7 according to some exemplary embodiments. FIG. 9 is a graph illustrating the electrical resistance to force of a force sensing layer included in the force sensor of FIG. 7 according to some exemplary embodiments.

First, referring to FIG. 5, the first force sensor 100 extends in one direction in a plane. In this case, the length of the first force sensor 100 in the extending direction may be greater than the width of the first force sensor 100. The width of the first force sensor 100 may be about 2 mm to about 6 mm. The length of the first force sensor 100 may be substantially similar to the lengths of the first and second long sides LS1 and LS2 of the display device 1. The length of the first force sensor 100 may be, but is not limited to, about 80% to about 98% of the lengths of the first and second long sides LS1 and LS2 of the display device 1. In some exemplary embodiments, the length of the first force sensor 100 may be in the range of about 50 mm to about 300 mm, such as in a range of about 100 mm to about 150 mm. The shape of the first force sensor 100 may vary depending on the position of the first force sensor 100.

The first force sensor 100 includes a first substrate 110 and a second substrate 120 facing each other. The first substrate 110 includes a first base 111 and an electrode layer 112. The second substrate 120 includes a second base 121 and the force sensing layer 122 (or a force sensitive layer). The first substrate 110 and the second substrate 120 are bonded together by a bonding layer 130. The first substrate 110 and the second substrate 120 may be, but are not limited to, films.

Each of the first base 111 and the second base 121 may include a polyethylene, polyimide, polycarbonate, polysulfone, polyacrylate, polystyrene, polyvinyl chloride, polyvinyl alcohol, polynorbornene, or polyester-based material. In some exemplary embodiments, each of the first base 111 and the second base 121 may be made of a polyethylene terephthalate (PET) film or a polyimide film.

The electrode layer 112 is disposed on a surface of the first base 111. The surface of the first base 111 is a surface facing the second base 121. The thickness of the electrode layer 112 may be about 2 μm to about 8 μm. For example, the thickness of the electrode layer 112 may be about 4 μm. The electrode layer 112 may include a conductive material, such as silver (Ag) or copper (Cu). The electrode layer 112 may be formed by a screen printing method.

The first base 111 may include a protrusion 111P formed on one side. Pads may be formed on the protrusion 111P, and the first base 111 may be coupled to the first sensing flexible circuit board 150 by (or via) the protrusion 111P.

The force sensing layer 122 is disposed on a surface of the second base 121. The surface of the second base 121 is a surface facing the first base 111. The force sensing layer 122 may include a force sensitive material. The force sensitive material may include metal nanoparticles, such as nickel, aluminum, tin, or copper, or may include carbon. The force sensitive material may be provided in a polymer resin in the form of, but not limited to, particles. As illustrated in FIG. 9, the electrical resistance of the force sensing layer 122 decreases as the force increases. By using this characteristic of the force sensing layer 122, the first force sensor 100 can sense whether a force has been (or is) applied and the magnitude of the force.

The force sensing layer 122 may be thicker than the electrode layer 112. The thickness of the force sensing layer 122 may be about 4 μm to about 12 μm. For example, the thickness of the force sensing layer 122 may be about 8 μm.

The first force sensor 100 may further include the bonding layer 130 disposed between the first base 111 and the second base 121 to bond the first base 111 and the second base 121. The bonding layer 130 may be disposed along the periphery of the first base 111 and the second base 121. In some exemplary embodiments, the bonding layer 130 may completely surround the periphery of the first base 111 and the second base 121 to seal the first force sensor 100. That is, the bonding layer 130 may serve as a gasket. The bonding layer 130 may also serve as a spacer that maintains a constant gap between the first base 111 and the second base 121. The bonding layer 130 may not overlap the electrode layer 112 or the force sensing layer 122. The thickness of the bonding layer 130 may be in the range of about 5 μm to about 50 μm, such as in a range of about 12 μm to about 30 μm.

The bonding layer 130 may be made of a pressure-sensitive adhesive layer or an adhesive layer. The bonding layer 130 may first be attached to the surface of the first base 111 or the surface of the second base 121 and then attached to the surface of the other base 111 or 121 in the process of assembling the first base 111 and the second base 121. Alternatively, a bonding layer may be provided on each of the surface of the first base 111 and the surface of the second base 121, and then the bonding layer of the first base 111 and the bonding layer of the second base 121 may be attached to each other in the process of assembling the first base 111 and the second base 121.

The first force sensor 100 may be placed in the display device 1 such that the first base 111 having the electrode layer 112 faces the display panel 30. That is, the other surface (outer surface) of the first base 111 may be attached to the lower surface of the display panel 30, and the other surface (outer surface) of the second base 121 may be attached to the bracket 50. However, exemplary embodiments are not limited to this case. For instance, the arrangement directions of the first base 111 and the second base 121 in the display device 1 may be opposite to the aforementioned directions.

Referring to FIG. 6, the first force sensor 100 includes a driving line TL, first through $p^{th}$ sensing lines RL1 through RLp (where p is an integer of 2 or more), a driving pad TP, first through $p^{th}$ sensing pads RP1 through RPp, and force sensing cells CE1 through CEp. The driving pad TP and the first through $p^{th}$ sensing pads RP1 through RPp may be referred to as a pad unit PAD_S.

The force sensing cells CE1 through CEp may independently sense forces at their corresponding positions. In FIG. 6, the force sensing cells CE1 through CEp are arranged in one column. However, exemplary embodiments are not limited to this case. The force sensing cells CE1 through CEp may also be arranged in a plurality of columns or any other suitable arrangement or pattern. In addition, the force sensing cells CE1 through CEp may be arranged at predetermined intervals as illustrated in FIG. 6 or may be arranged successively or randomly.

The force sensing cells CE1 through CEp may have different areas depending on their use. For example, when the force sensing cells CE1 through CEp are used in place of a physical button, such as a volume control button disposed on a side surface of the display device 1, the force sensing cells CE1 through CEp may be formed to have an area similar to the area of the physical button.

Each of the force sensing cells CE1 through CEp may be connected to at least one driving line and at least one sensing line. For example, as illustrated in FIG. 6, the force sensing cells CE1 through CEp may be commonly connected to one driving line TL and may be connected to the sensing lines RL1 through RLp on a one-to-one basis. The first force sensing cell CE1 may be connected to the driving line TL and the first sensing line RL1, and the $i^{th}$ force sensing cell CEi (where "i" is a positive integer equal to or greater than 2 and smaller than "p") may be connected to the driving line TL and the $i^{th}$ sensing line RLi. In addition, the $(i+1)^{th}$ force sensing cell CEi+1 may be connected to the driving line TL and the $(i+1)^{th}$ sensing line RLi+1, and the $p^{th}$ force sensing cell CEp may be connected to the driving line TL and the $p^{th}$ sensing line RLp.

The driving line TL may be connected to the driving pad TP, and the first through $p^{th}$ sensing lines RL1 through RLp may be connected to the first through $p^{th}$ sensing pads RP1 through RPp on a one-to-one basis. The first sensing line RL1 may be connected to the first sensing pad RP1, the $i^{th}$ sensing line RLi may be connected to the $i^{th}$ sensing pad RPi, the $(i+1)^{th}$ sensing line RLi+1 may be connected to the $(i+1)^{th}$ sensing pad RPi+1, and the $p^{th}$ sensing line RLp may be connected to the $p^{th}$ sensing pad RPp. The driving pad TP and the first through $p^{th}$ sensing pads RP1 through RPp may be disposed on the protrusion 111P of the first base 111 and may be connected to the first sensing flexible circuit board 150 (see FIG. 2) by, e.g., an anisotropic conductive film. Since the first sensing flexible circuit board 150 is connected to a central portion of the first force sensor 100, the driving pad TP may be positioned between the $i^{th}$ sensing pad RPi and the $(i+1)^{h}$ sensing pad RPi+1. In this case, the driving line TL may be disposed between the $i^{th}$ force sensing cell CEi and the $(i+1)^{th}$ force sensing cell CEi+1, may extend along a side of the first force sensor 100 (e.g., a side opposite to a side on which the protrusion 111P is located), and may be electrically connected to the first through $p^{th}$ force sensing cells CE1 through CEp.

The first force sensor 100 may operate based on a driving voltage provided through the first sensing flexible circuit board 150 (see FIG. 2) from a force sensing unit (not illustrated) (e.g., a force sensing unit mounted on the main circuit board 90). The force sensing unit may apply a driving voltage to the driving line TL through the driving pad TP and sense current values or voltage values from the sensing lines RL1 through RLp through the sensing pads RP1 through RPp, thereby sensing forces applied to the force sensing cells CE1 through CEp.

Referring to FIG. 7, each of the force sensing cells CE1 through CEp includes a driving connection electrode TCE, a sensing connection electrode RCE, first driving electrodes TE1, first sensing electrodes RE1, and a force sensing layer PSL.

The driving connection electrode TCE (or a first stem electrode) is connected to the driving line TL and the first driving electrodes TE1 (or first branch electrodes). The driving connection electrode TCE extends in a longitudinal direction (e.g., a vertical direction) and is connected to the driving line TL through an end (e.g., a lower end). The first driving electrodes TE1 may branch from the driving connection electrode TCE in a width direction (e.g., a horizontal direction) of the driving connection electrode TCE.

The sensing connection electrode RCE (or a second stem electrode) is connected to any one of the sensing lines RL1 through RLp (where, as an example, p is 8 in FIG. 7) and the first sensing electrodes RE1 (or second branch electrodes). For example, the sensing connection electrode TCE is connected to any one of the sensing lines RL1 through RL8 at one end in the longitudinal direction. The first sensing electrodes RE1 may branch from the sensing connection electrode RCE in the width direction (e.g., an X-axis direction) of the sensing connection electrode RCE.

As illustrated in FIG. 8, the first driving electrodes TE1 and the first sensing electrodes RE1 may be disposed on the same layer. The first driving electrodes TE1 and the first sensing electrodes RE1 may be made of the same material. The first driving electrodes TE1 and the first sensing electrodes RE1 may be included in the electrode layer 112 described above with reference to FIG. 5.

The first driving electrodes TE1 and the first sensing electrodes RE1 are disposed adjacent to each other, but are not connected to each other. The first driving electrodes TE1 and the first sensing electrodes RE1 may be arranged parallel to each other. The first driving electrodes TE1 and the first sensing electrodes RE1 may be alternately arranged in the longitudinal direction of the driving connection electrode TCE and the sensing connection electrode RCE. That is, the first driving electrodes TE1 and the first sensing electrodes RE1 may be repeatedly arranged in the longitudinal direction of the driving connection electrode TCE and the sensing connection electrode RCE in the order of the first driving electrode TE1, the first sensing electrode RE1, the first driving electrode TE1, and the first sensing electrode RE1.

The force sensing layer 122 is disposed on the surface of the second base 121 as described above with reference to FIG. 5. The force sensing layer 122 may overlap the first driving electrodes TE1 and the first sensing electrodes RE1.

When no force is applied to the second base 121 in the thickness direction of the first force sensor 100, a gap exists between the force sensing layer 122 and the first driving electrodes TE1 and between the force sensing layer 122 and the first sensing electrodes RE1 as illustrated in FIG. 8. That is, when no force is applied to the second base 121, the force sensing layer 122 is separated from the first driving electrodes TE1 and the first sensing electrodes RE1.

When a force is applied to the second base 121 in the thickness direction of the first force sensor 100, the force sensing layer 122 is brought into contact with the first driving electrodes TE1 and the first sensing electrodes RE1. Accordingly, the first driving electrodes TE1 and the first sensing electrodes RE1 may be physically connected to each other by the force sensing layer 122, and the force sensing layer 122 may act as an electrical resistance.

Figure 10:
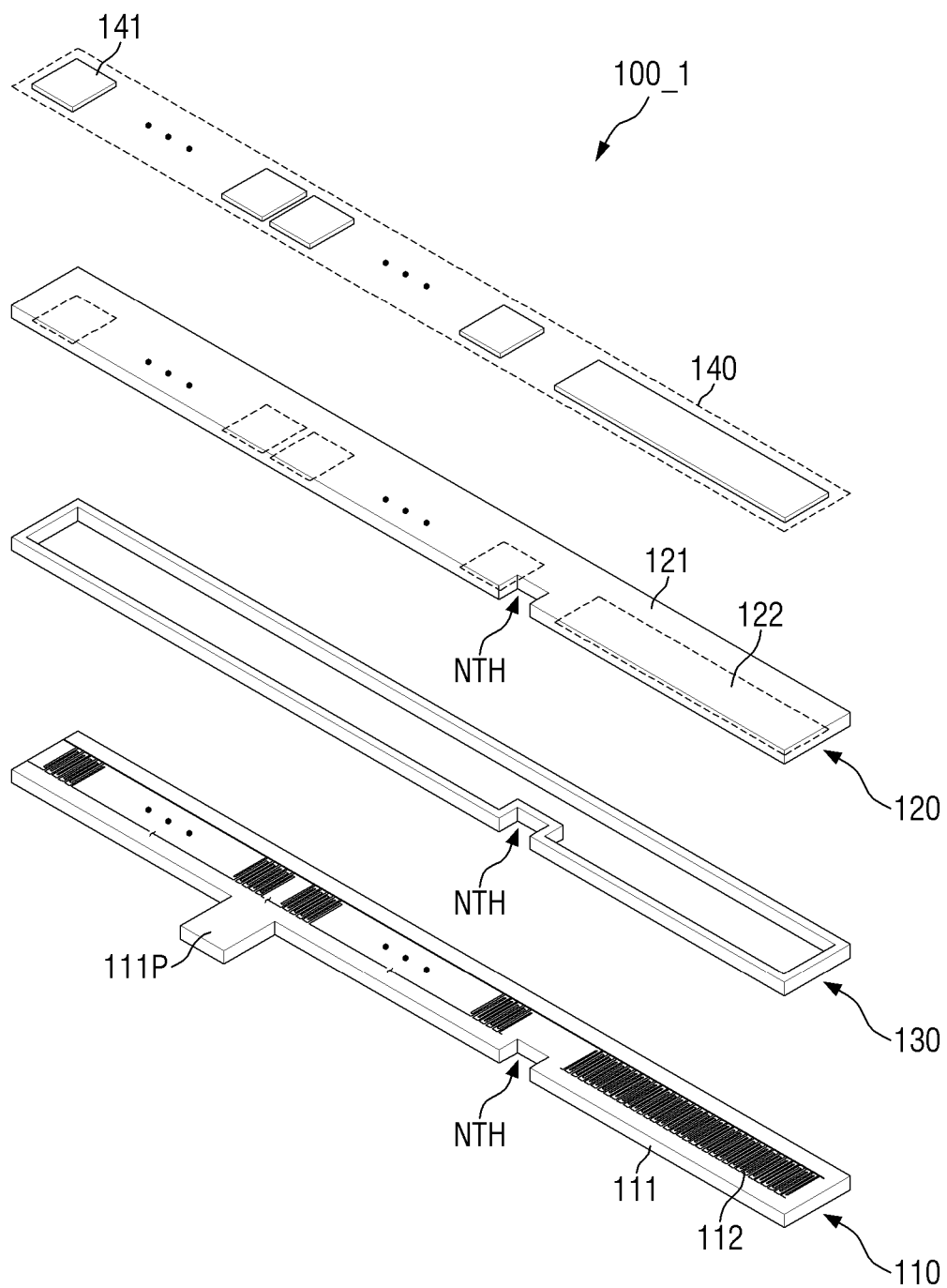
FIG. 10 is an exploded perspective view of another example of the force sensor included in the display device of FIG. 2 according to some exemplary embodiments.

In some exemplary embodiments, the first force sensor 100 may further include a bump member 140. FIG. 10 can be referred to for the description of the bump member 140.

FIG. 10 is an exploded perspective view of another example of the force sensor included in the display device of FIG. 2 according to some exemplary embodiments.

Referring to FIG. 10, a bump member 140 may be disposed on a surface of a first force sensor 100_1. The bump member 140 may include a plurality of first bump members 141 separated from each other. The first bump members 141 may overlap a force sensing layer 122. Each of the first bump members 141 may partially overlap a corresponding portion of the force sensing layer 122.

The bump member 140 may effectively transmit the force applied externally to the first force sensor 100_1. That is, the bump member 140 allows a touch force input by a user to be concentrated on the first force sensor 100_1. To this end, the bump member 140 may be made of a flexible metal, for example, copper. However, the material of the bump member 140 is not particularly limited, and the bump member 140 may also be made of a flexible material, such as plastic, rubber, etc.

In FIG. 10, the bump member 140 is disposed on an upper surface of the first force sensor 100_1 (that is, on a surface of a second base 121). However, exemplary embodiments are not limited to this case. For example, the bump member 140 may be disposed on a lower surface of the first force sensor 100_1 (that is, a surface of a first base 111 or on each of the upper surface and lower surface of the first force sensor 100_1.

Figure 11:
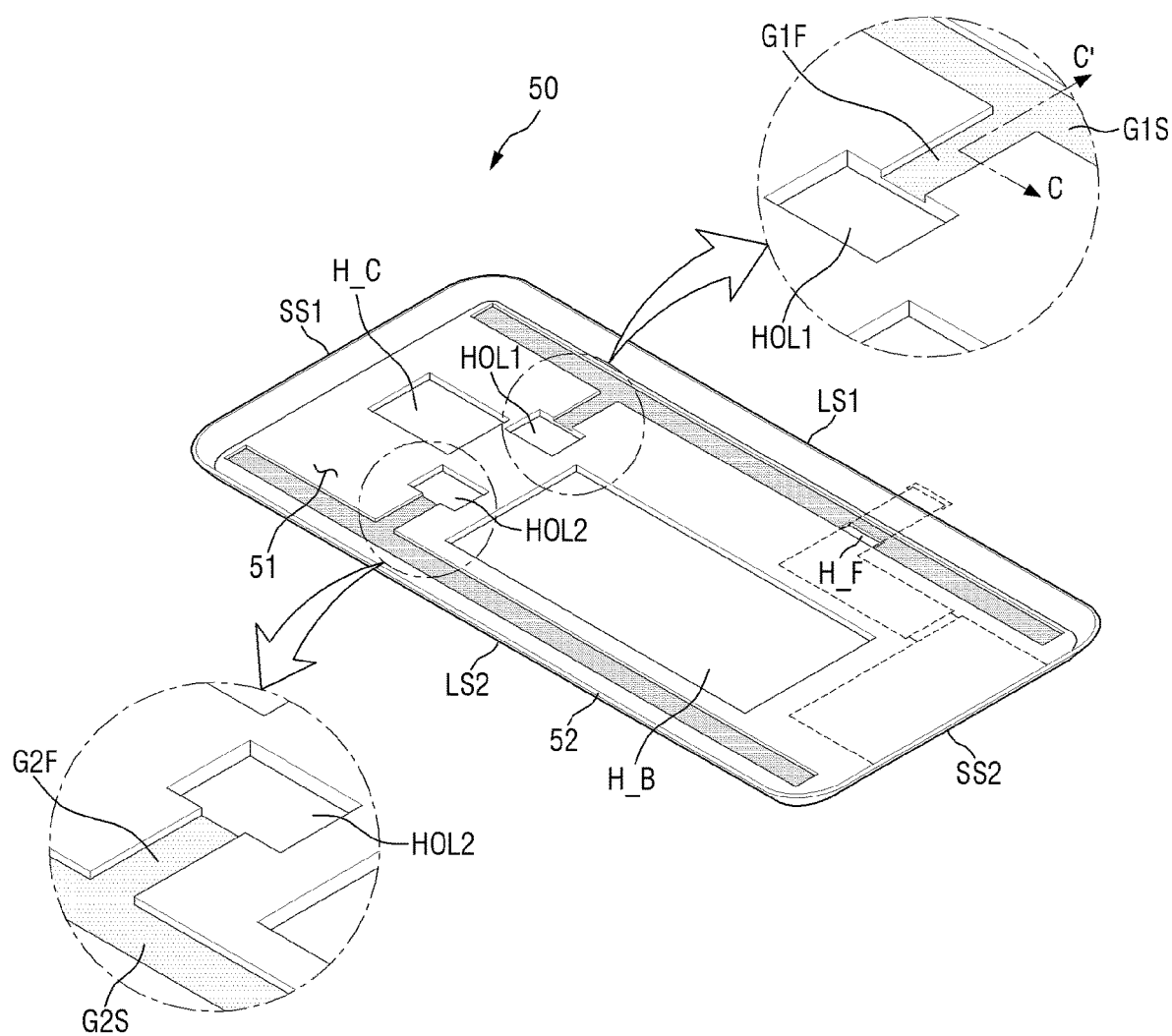
FIG. 11 is a perspective view of an example of a bracket included in the display device of FIG. 2 according to some exemplary embodiments.
Figure 12:
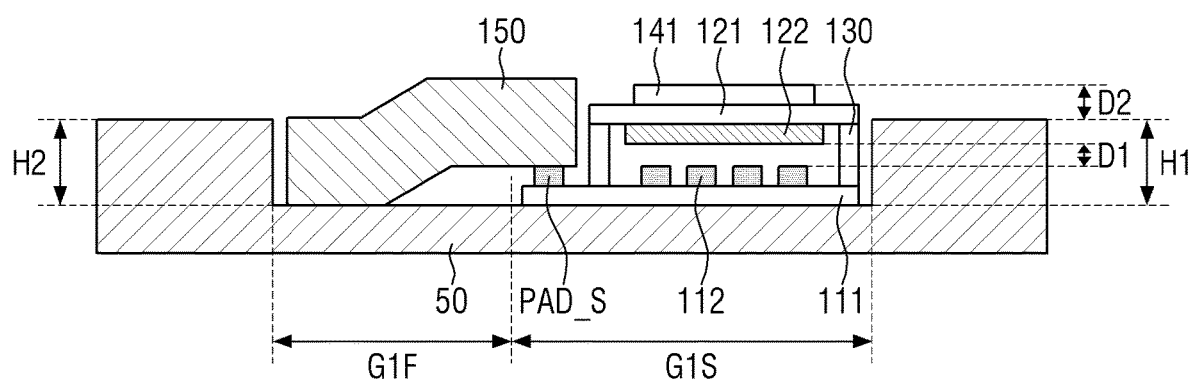
FIG. 12 is a cross-sectional view of an example of the bracket taken along sectional line C-C' of FIG. 11 according to some exemplary embodiments.

FIG. 11 is a perspective view of an example of a bracket included in the display device of FIG. 2 according to some exemplary embodiments. FIG. 12 is a cross-sectional view of an example of the bracket taken along sectional line C-C' of FIG. 11 according to some exemplary embodiments. For ease of description, in FIG. 12, the first force sensor 100_1 is illustrated as being disposed on the flat portion, not the curved portion. Further, although FIG. 12 is described in association with first force sensor 100_1, the various features are similarly applicable to the first force sensor 100 described with reference to FIGS. 5-9.

Referring to FIGS. 11 and 12, a bracket 50 may include a first hole HOL1 and a second hole HOL2. In addition, the bracket 50 may further include first and second guide grooves G1F and G2F and first and second fixing grooves G1S and G2S. The first hole HOL1 and the second hole HOL2 may be spaced apart from each other between a sensor hole H_C and a battery hole H_B, but exemplary embodiments are not limited to this case.

The first guide groove G1F may extend from the first hole HOL1 toward a first long side LS1 of the bracket 50. The first guide groove G1F may overlap the first sensing flexible circuit board 150 of the first force sensor 100_1 and have an area larger than the area (or width and/or length) of the first sensing flexible circuit board 150. A second depth H2 of the first guide groove G1F may be smaller than the thickness of a bottom portion 51 (see FIG. 3) of the bracket 50.

An end of the first guide groove G1F may be connected to the first fixing groove G1S, and the first fixing groove G1S may extend along the first long side LS1. The first fixing groove G1S may overlap a sensor portion of the first force sensor 100_1 (e.g., the first force sensor 100_1 illustrated in FIG. 10) and have an area larger than the area (or width and/or length) of the sensor portion. A first depth H1 of the first fixing groove G1S may be, but is not limited to, being equal to the second depth H2. A connect hole H_F may be formed in the first fixing groove G1S.

The second guide groove G2F and the second fixing groove G2S are substantially the same as or similar to the first guide groove G1F and the first fixing groove G1S, respectively. Thus, a redundant description will not be repeated.

In some exemplary embodiments, the first depth H1 of the first fixing groove G1S may be smaller than the thickness of the first force sensor 100_1 by a first gap D1 (e.g., a gap between the electrode layer 112 and the force sensing layer 122) or more. In this case, the first force sensor 100_1 may protrude from the bracket 50 by a second gap D2 greater than the first gap D1. Therefore, when a force is applied to the first force sensor 100_1, the external force can be completely (or at least mainly) transmitted to the first force sensor 100_1 without being dispersed to the bracket 50.

As illustrated in FIG. 12, the first sensing flexible circuit board 150 may be coupled to the pad unit PAD_S formed on the protrusion 111P (see FIG. 10) of the first force sensor 100_1. The thickness of the first sensing flexible circuit board 150 may be greater than the thickness of the first force sensor 100_1. However, since the first sensing flexible circuit board 150 is spaced apart from the first force sensor 100_1 (or the first bump members 141 of the first force sensor 100_1), it may not affect the operation (e.g., force sensing) of the first force sensor 100_1.

Since the bracket 50 includes the first and second guide grooves G1F and G2F and the first and second fixing grooves G1S and G2S as described above with reference to FIGS. 11 and 12, the first force sensor 100_1 and the second force sensor 200 can be easily arranged on the bracket 50, and the display panel 30 (see FIG. 2), the first and second force sensors 100_1 and 200 and the bracket 50 can be easily coupled to each other.

Although not illustrated in FIGS. 11 and 12, adhesive layers may be disposed on the first and second fixing grooves G1S and G2S, and the first and second force sensors 100_1 and 200 may be fixed to the first and second fixing grooves G1S and G2S via the adhesive layers, respectively.

Figure 13:
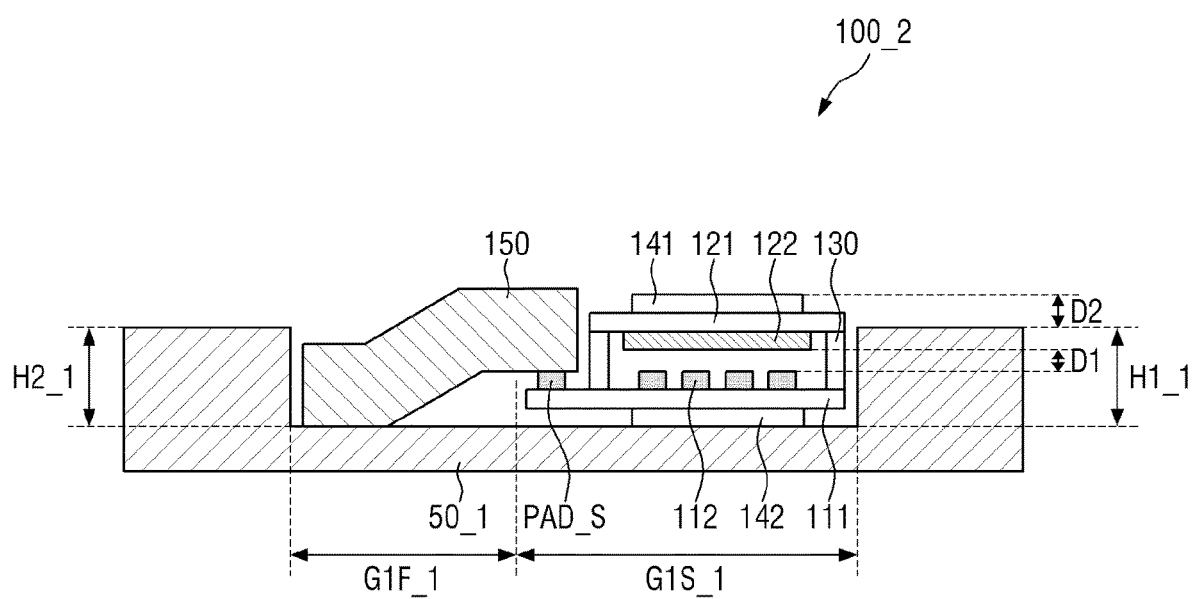
FIGS. 13, 14, and 15 are cross-sectional views of various brackets included in the display device of FIG. 2 according to some exemplary embodiments.
Figure 14:
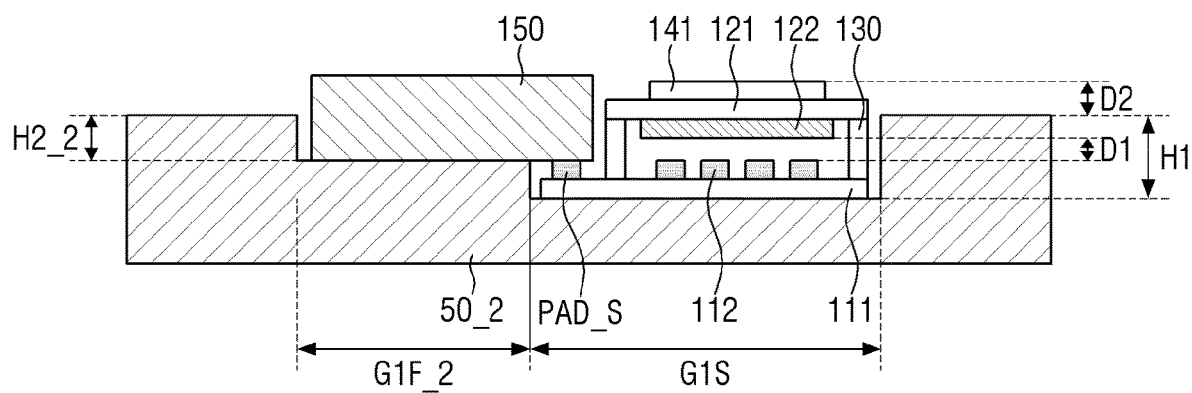
Figure 15:
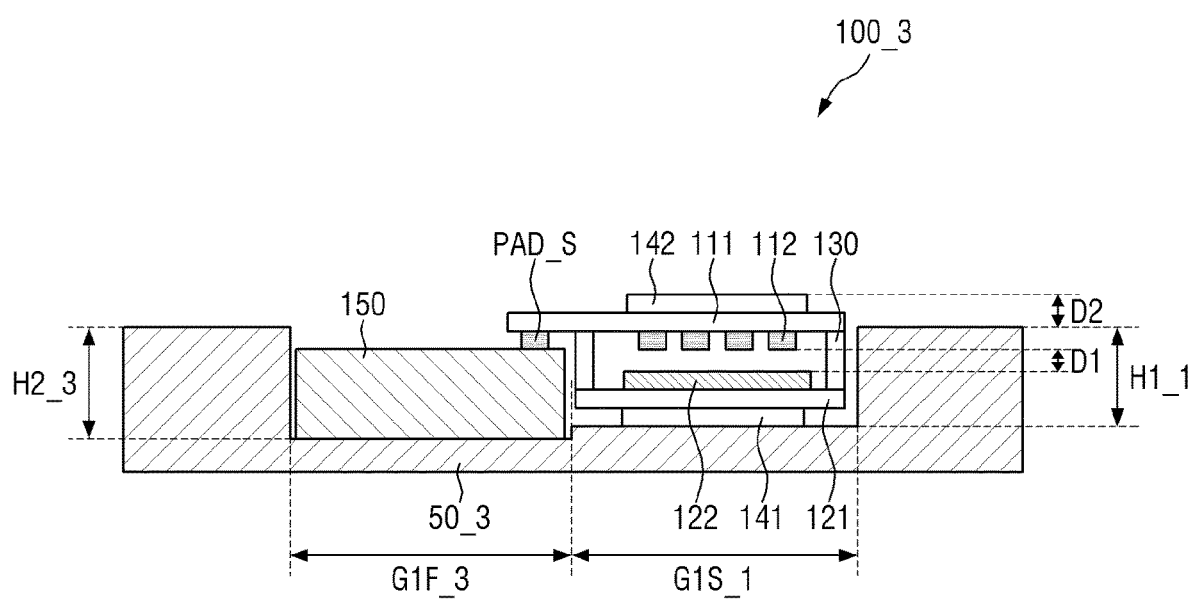

FIGS. 13 through 15 are cross-sectional views of various brackets that may be included in the display device of FIG. 2 according to some exemplary embodiments. In FIGS. 13 through 15, cross-sectional views corresponding to the cross-sectional view of FIG. 12 are illustrated.

Referring first to FIG. 13, a bracket 50_1 is different from the bracket 50 of FIG. 12 in that it includes a relatively deeper first fixing groove G1S_1 and a relatively deeper first guide groove G1F_1 at least because a first force sensor 100_2 further includes a second bump member 142.

A first depth H1_1 of the first fixing groove G1S_1 may be determined based on the thickness of the first force sensor 100_2. For example, the first depth H1_1 of the first fixing groove G1S_1 may be set to be smaller than the thickness of the first force sensor 100_2 by a preset gap (for example, a first gap D1).

Referring to FIG. 14, a bracket 50_2 is different from the bracket 50 of FIG. 12 in that it includes a first guide groove G1F_2 having a second depth H2_2 different from a first depth H1 of a first fixing groove G1S.

As described above with reference to FIGS. 12 and 13, the first depth H1 (or H1_1) of the first fixing groove G1S (or G11S_1) may be determined by the thickness of the first force sensor 100_1 (or 100_2). The first depth H1 of the first fixing groove G1S may be equal to the first depth H1 of the first fixing groove G1S described with reference to FIG. 12.

The second depth H2_2 of the first guide groove G1F_2 may be smaller than the first depth H1 of the first fixing groove G1S. For example, the second depth H2_2 of the first guide groove G1F_2 may be smaller than the first depth H1 of the first fixing groove G1S by the step height of a pad unit PAD_S. In this case, the first sensing flexible circuit board 150 may be flat without being bent.

Referring to FIG. 15, a bracket 50_3 is different from the bracket 50 of FIG. 12 in that it includes a first guide groove G1F_3 having a second depth H2_3 different from a first depth H1_1 of a first fixing groove G1S_1.

The second depth H2_3 of the first guide groove G1F_3 may be greater than the first depth H1_1 of the first fixing groove G1S_1. For example, the second depth H2_3 of the first guide groove G1F_3 may be greater than the first depth H1_1 of the first fixing groove G1S_1 by the step height of a pad unit PAD_S.

As illustrated in FIG. 15, a second base 121 of a first force sensor 100_2 may be disposed adjacent to the bracket 50_3. In this case, the pad unit PAD_S may be located on a lower surface of a first base 111, and a first sensing flexible circuit board 150 may be disposed below the first base 111. When the second depth H2_3 of the first guide groove G1F_3 is smaller than or equal to the first depth H1_1 of the first fixing groove G1S_1, the first force sensor 100_3 may not completely contact the bracket 50_3, but may be partially separated from the bracket 50_3 due to the thickness of the first sensing flexible circuit board 150. Therefore, the first depth H2_3 of the first guide groove G1F_3 may be greater than the first depth H1_1 of the first fixing groove G1S_1, so that the first force sensor 100_3 can be completely supported by the bracket 50_3 and can be prevented from malfunctioning.

As described above with reference to FIGS. 13 through 15, the first depth H1 or H1_1 of the first fixing groove G1S (or G1S_1) may be determined by the thickness of the first force sensor 100, 100_1, 100_2, or 100_3, and the second depth H2, H2_1, H2_2, or H2_3 of the first guide groove G1F, G1F_1, G1F_2, or G1F_3 may be equal to or different from the first depth H1 or H1_1 of the first fixing groove G1S or G1S_1 depending on the placement of the first force sensor 100, 100_1, 100_2, or 100_3.

Figure 16:
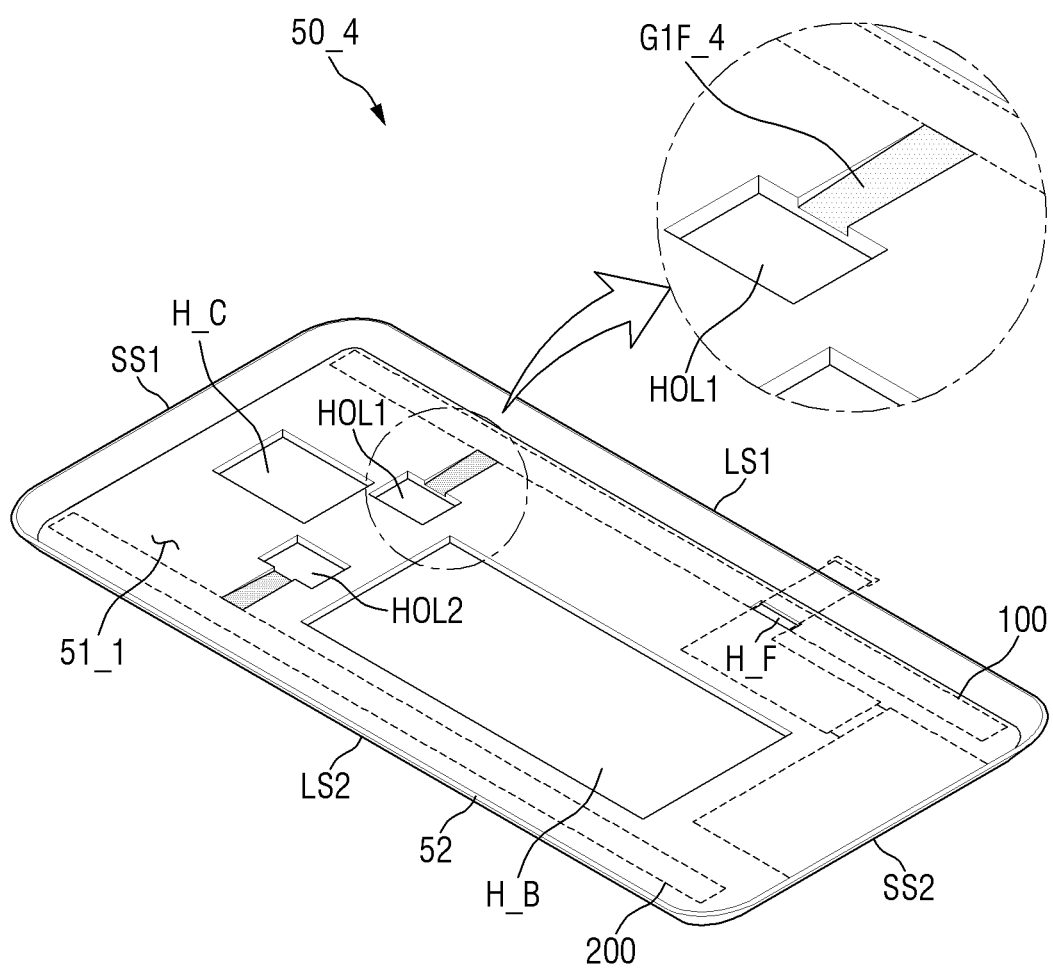
FIG. 16 is a perspective view of another example of the bracket included in the display device of FIG. 2 according to some exemplary embodiments.

FIG. 16 is a perspective view of another example of the bracket included in the display device of FIG. 2 according to some exemplary embodiments.

Referring to FIGS. 11 and 16, a bracket 50_4 is different from the bracket 50 of FIG. 11 in that it includes a first guide groove G1F_4 and a second guide groove. In addition, the bracket 50_4 may not include the fixing grooves G1S and G2S illustrated in FIG. 11. That is, the bottom portion 51_1 may be free of the first grooves G1S and G2S. The bracket 50_4 may be substantially the same as or similar to the bracket 50 of FIG. 11 except for the first guide groove G1F_4, the second guide groove, and the fixing grooves G1S and G2S. In addition, since the second guide groove is substantially the same as the first guide groove G1F_4, a redundant description will not be repeated.

As described and illustrated in association with FIG. 3, the first force sensor 100 may be directly fixed by the cover panel sheet 40 and the bracket 50_4. On the other hand, the first sensing flexible circuit board 150 (see FIG. 3) of the first force sensor 100 may be spaced apart from the cover panel sheet 40, and, thus, may not be fixed by the cover panel sheet 40. As such, not only can the first force sensor 100 (or the first sensing flexible circuit board 150) be fixed in the process of coupling the first force sensor 100 to the bracket 50_4 through the first guide groove G1F, but movement or displacement of the first sensing flexible circuit board 150 can also be reduced or prevented after the first force sensor 100 is coupled to the bracket 50_4.

In some exemplary embodiments, the first guide groove G1F_4 may have both ends of different depths. For example, as illustrated in FIG. 16, the depth of one end of the first guide groove G1F_4 connected to a first hole HOL1 may be greater than the depth of the other end in contact with the first force sensor 100 (not illustrated). The depth of the other end of the first guide groove G1F_4 in contact with the first force sensor 100 may be substantially zero. In addition, the depth of the first guide groove G1F_4 may increase toward the first hole HOL1 and decrease toward the sensor portion of the first force sensor 100 (e.g., the first force sensor 100 illustrated in FIG. 5). Therefore, the stress on a connection portion of the first sensing flexible circuit board 150 can be reduced by the step height of the first guide groove G1F_4 on the sensor portion side of the first force sensor 100.

Figure 17:
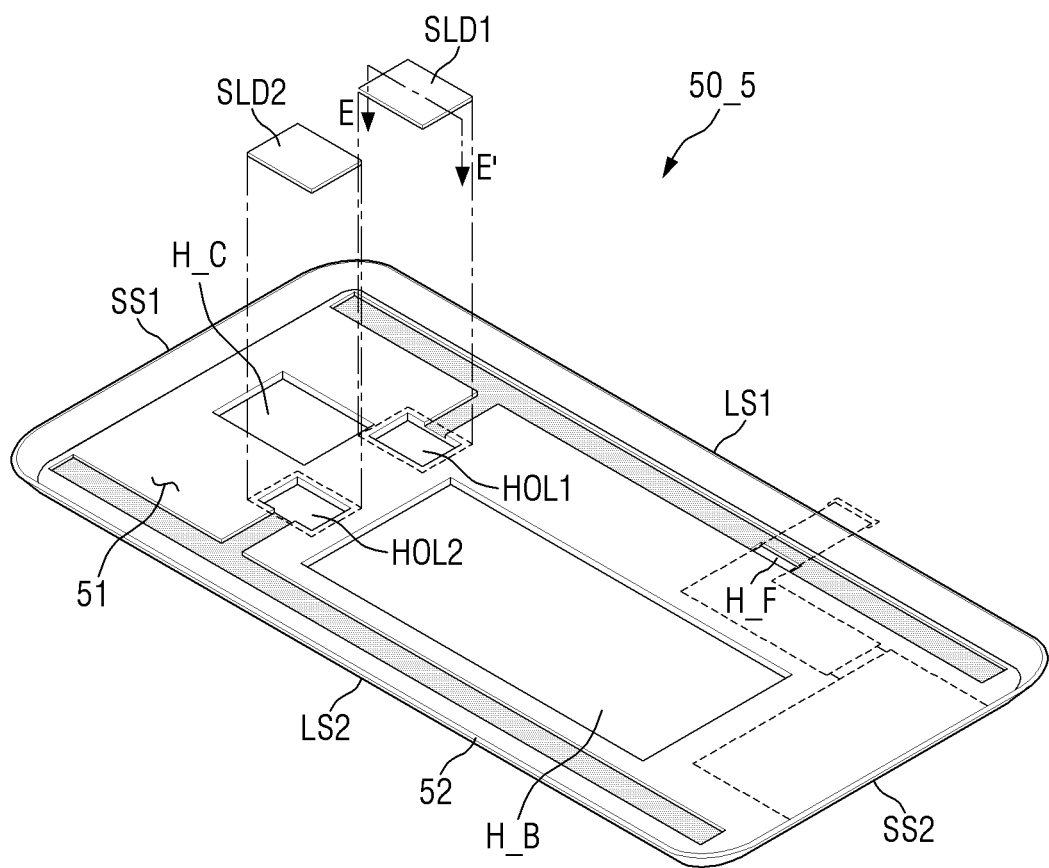
FIG. 17 is a perspective view of another example of the bracket included in the display device of FIG. 2 according to some exemplary embodiments.
Figure 18:
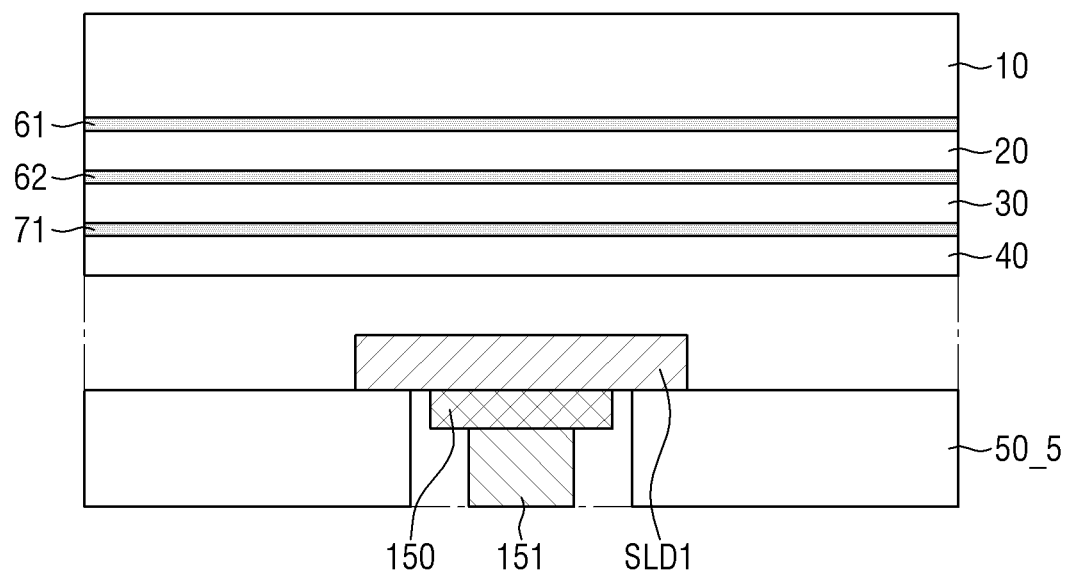
FIG. 18 is a cross-sectional view of an example of the display device taken along sectional line E-E' of FIG. 17 according to some exemplary embodiments.

FIG. 17 is a perspective view of another example of the bracket included in the display device of FIG. 2 according to some exemplary embodiments. FIG. 18 is a cross-sectional view of an example of the display device taken along sectional line E-E' of FIG. 17 according to some exemplary embodiments.

Referring to FIGS. 11, 17, and 18, a bracket 50_5 (or a display device 1) is different from the bracket 50 of FIG. 11 in that it further includes first and second protective members SLD1 and SLD2. Since the second protective member SLD2 is substantially the same as or similar to the first protective member SLD1 except for its position, a redundant description will not be repeated.

The first protective member SLD1 and the second protective member SLD2 may be disposed on a bottom portion 51 of the bracket 50_5. The first protective member SLD1 may overlap a first hole HOL1 and have a size larger than the size (e.g., planar area) of the first hole HOL1. Similarly, the second protective member SLD2 may cover a second hole HOL2. The first protective member SLD1 and the second protective member SLD2 are protective films and may include, but are not limited to, an insulating material.

As illustrated in FIG. 18, the first protective member SDL1 may cover a first sensing flexible circuit board 150 in the first hole HOL1 (or a region including the first hole HOL1) and contact an upper surface of the bracket 50_5 (for example, the upper surface of the bracket 50_5 adjacent to edges of the first hole HOL1). The first protective member SDL1 may be coupled to the upper surface of the bracket 50_5 by an adhesive or an adhesive tape.

The first protective member SLD1 may prevent upward movement of the first sensing flexible circuit board 150 and a first connector 151 and strengthen the connection between the first connector 151 and a main circuit board 90 (see FIG. 3).

Figure 19:
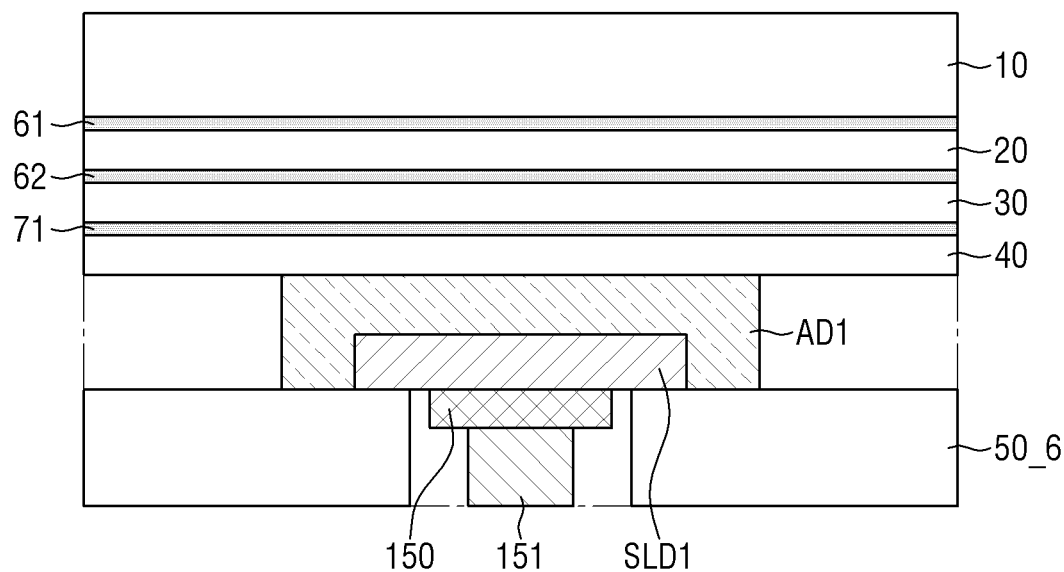
FIGS. 19 and 20 are cross-sectional views of other examples of the display device taken along sectional line E-E' of FIG. 17 according to some exemplary embodiments.
Figure 20:
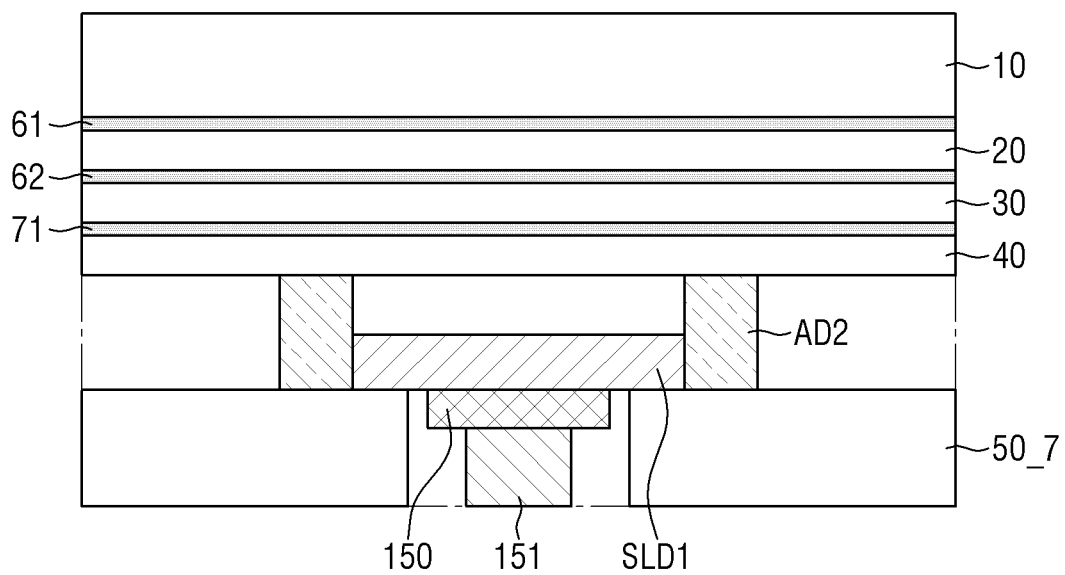

FIGS. 19 and 20 are cross-sectional views of other examples of the display device taken along sectional line E-E' of FIG. 17 according to some exemplary embodiments.

Referring to FIGS. 18 and 19, a bracket 50_6 (or a display device 1) is different from the bracket 50_5 of FIG. 18 in that it further includes a first intermediate member AD1.

The first intermediate member AD1 may be disposed on a first protective member SLD1 and a cover panel sheet 40 and may be located above a first hole HOL1 to remove a gap between the first protective member SLD1 and the cover panel sheet 40. The first intermediate member AD1 may be an adhesive or filler, such as resin. The first intermediate member AD1 may cover the first protective member SLD1 and may directly contact an upper surface of the bracket 50_6.

In addition, although the first intermediate member AD1 has been described as being located on the first hole HOL1 in FIG. 19, exemplary embodiments are not limited to this case. The first intermediate member AD1 may also be disposed on a second hole HOL2 (see FIG. 17) and a second protective member SLD2 (see FIG. 17). In addition, although the first intermediate member AD1 has been described as covering the first protective member SLD1, exemplary embodiments are not limited to this case. The first intermediate member AD1 may also partially overlap the first protective member SLD1.

Referring to FIGS. 18 and 20, a bracket 50_7 (or a display device 1) is different from the bracket 50_5 of FIG. 18 in that it further includes a second intermediate member AD2.

The second intermediate member AD2 may be, except for its position, substantially the same as or similar to the first intermediate member AD1 described above with reference to FIG. 19. The second intermediate member AD2, however, may not overlap the first protective member SLD1. The second intermediate member AD2 may be disposed along edges of the first protective member SLD1 (or a first hole HOL1) between a cover panel sheet 40 and the bracket 50_7. The second intermediate member AD2 may prevent the relative movement of the cover panel sheet 40 and the bracket 50_7 and prevent, at the sides, the displacement of the first protective member SLD1.

Figure 21:
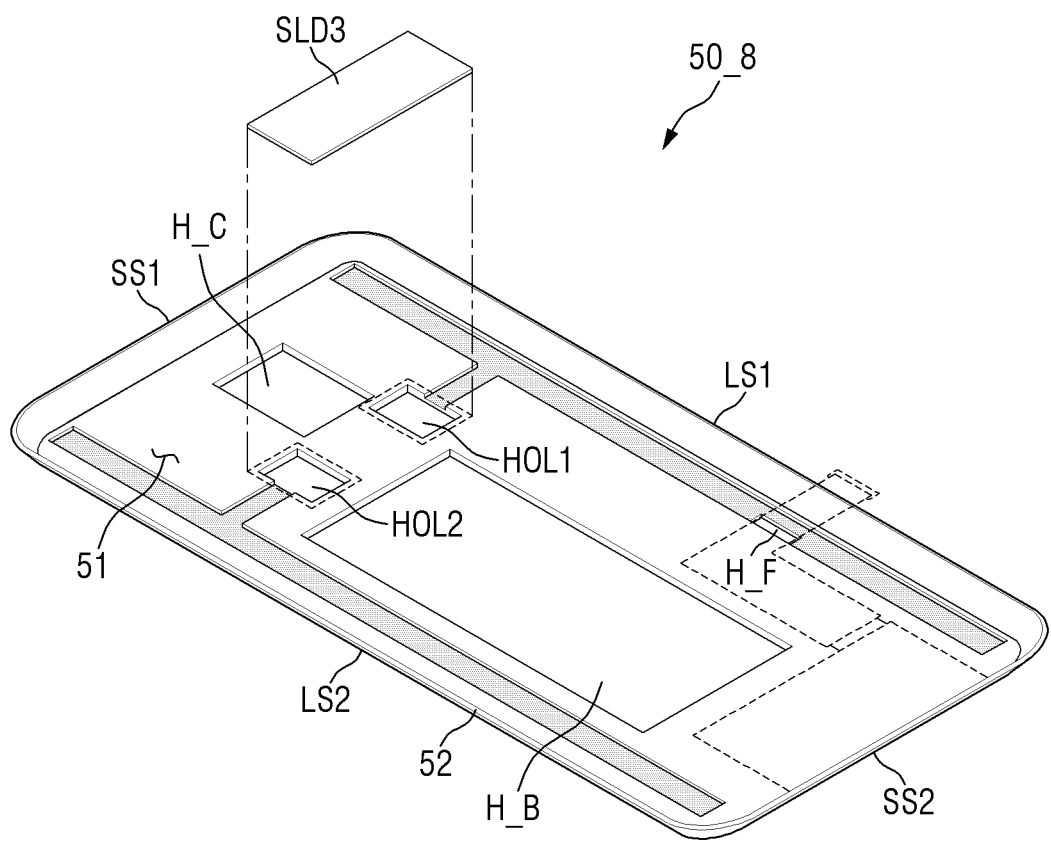
FIG. 21 is a perspective view of another example of the bracket included in the display device of FIG. 2 according to some exemplary embodiments.

FIG. 21 is a perspective view of another example of the bracket included in the display device of FIG. 2 according to some exemplary embodiments.

Referring to FIGS. 17 and 21, a bracket 50_8 is different from the bracket 50_5 of FIG. 17 in that it includes a third protective member SLD3.

The third protective member SLD3 may be, except for its size, substantially the same as or similar to the first protective member SLD1 described with above reference to FIG. 17. The third protective member SLD3, however, may cover a first hole HOL1 and a second hole HOL2. When the first hole HOL1 and the second hole HOL2 are formed adjacent to each other, one third protective member SLD3 may cover the first hole HOL1 and the second hole HOL2. This may simplify one or more manufacturing processes.

Figure 22:
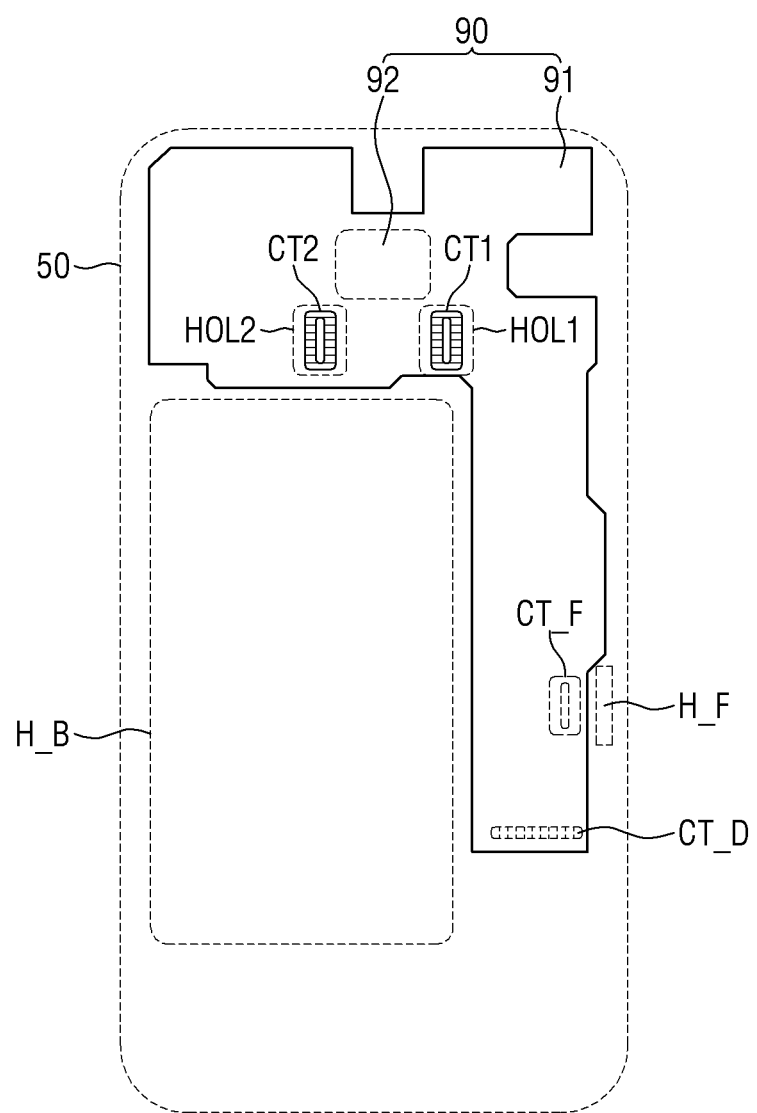
FIGS. 22 and 23 are views of an example of a main circuit board included in the display device of FIG. 2 according to some exemplary embodiments.
Figure 23:
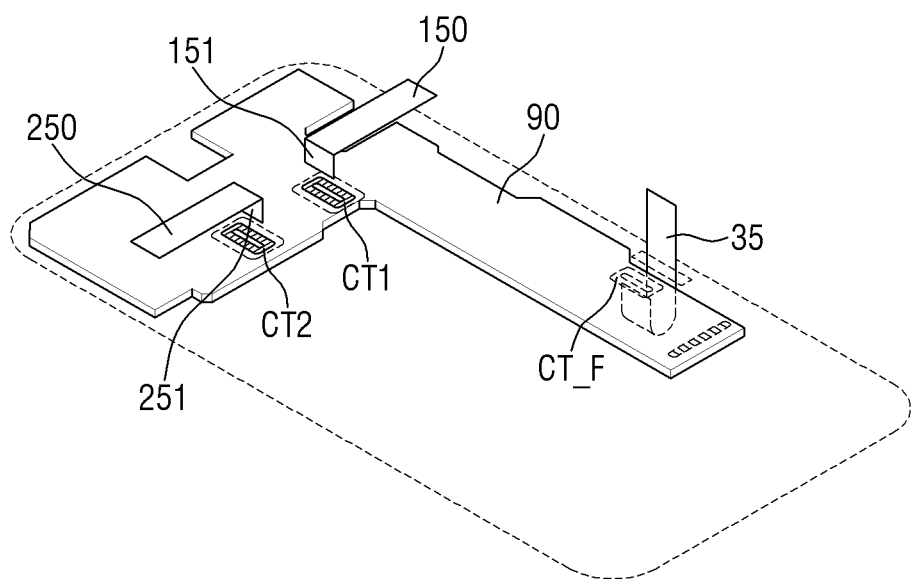

FIGS. 22 and 23 are views of an example of a main circuit board included in the display device of FIG. 2 according to some exemplary embodiments.

Referring to FIGS. 2, 22, and 23, a main circuit board 90 may include a substrate 91, connection terminals CT1, CT2, CT_F and CT_D, and a main processor 92.

The substrate 91 does not overlap the battery hole H_B of the bracket 50 and may have an "L" shape (or rotated "L" shape).

The first connection terminal CT1 may be disposed or formed on a first surface (e.g., an upper surface) of the substrate 91 to overlap the first hole HOL1 of the bracket 50. The first connection terminal CT1 may be exposed through the first hole HOL1 and may be connected or coupled to a first connector 151 of the first sensing flexible circuit board 150. For example, the first connection terminal CT1 may be a connect hole, and the first connector 151 may be inserted and connected to the first connection terminal CT1. However, this is merely an example, and the coupling relationship between the first connection terminal CT1 and the first connector 151 is not limited to this example. For example, each of the first connection terminal CT1 and the first connector 151 may include pads, and the first connection terminal CT1 and the first connector 151 may be coupled to each other by ultrasonic bonding, an anisotropic conductive film, etc.

Similarly, the second connection terminal CT2 may be disposed on the first surface of the substrate 91 to overlap the second hole HOL2 of the bracket 50. The second connection terminal CT2 may be exposed through the second hole HOL2 and may be connected or coupled to a second connector 251 of the second sensing flexible circuit board 250.

The main connection terminal CT_F may be disposed on a second surface (e.g., a lower surface) of the substrate 91 to be adjacent to the connect hole H_F of the bracket 50, but may not overlap the connect hole H_F. As illustrated in FIG.

23, the display connector 35 of the display flexible circuit board 31 may pass through the connect hole H_F of the bracket 50 and may be bent at one side and under the substrate 91 to be coupled to the main connection terminal CT_F. However, the main connection terminal CT_F is not limited to this example. For example, the main connection terminal CT_F may also be disposed on the first surface of the substrate 91 to overlap the connect hole H_F.

The dummy connection terminal CT_D may be coupled to another device or circuit board provided in the display device 1.

The main processor 92 may control all the functions of the display device 1. For example, the main processor 92 may output image data to a display driver (not illustrated) of the display flexible circuit board 31 so that the display panel 30 can display an image. In addition, the main processor 92 may receive touch data from a touch driver (not illustrated) (e.g., a touch driver mounted on the display flexible circuit board 31 or the touch flexible circuit board 21) and determine a touch position of a user. The main processor 92 may execute an application (or function) indicated by an icon displayed at the touch position of the user; however, any other suitable input may be associated with the touch interaction. In addition, the main processor 92 may receive force sensing data from a force sensing unit (not illustrated) (e.g., the touch driver mounted on the display flexible circuit board 31 or the touch flexible circuit board 21) and output the home screen, control the sound magnitude of the display device 1, control a haptic function to be implemented according to the force sensing data, and/or perform any other suitable function or control. The main processor 92 may be an application processor, central processing unit, system chip implemented as an integrated circuit, etc.

Figure 24:
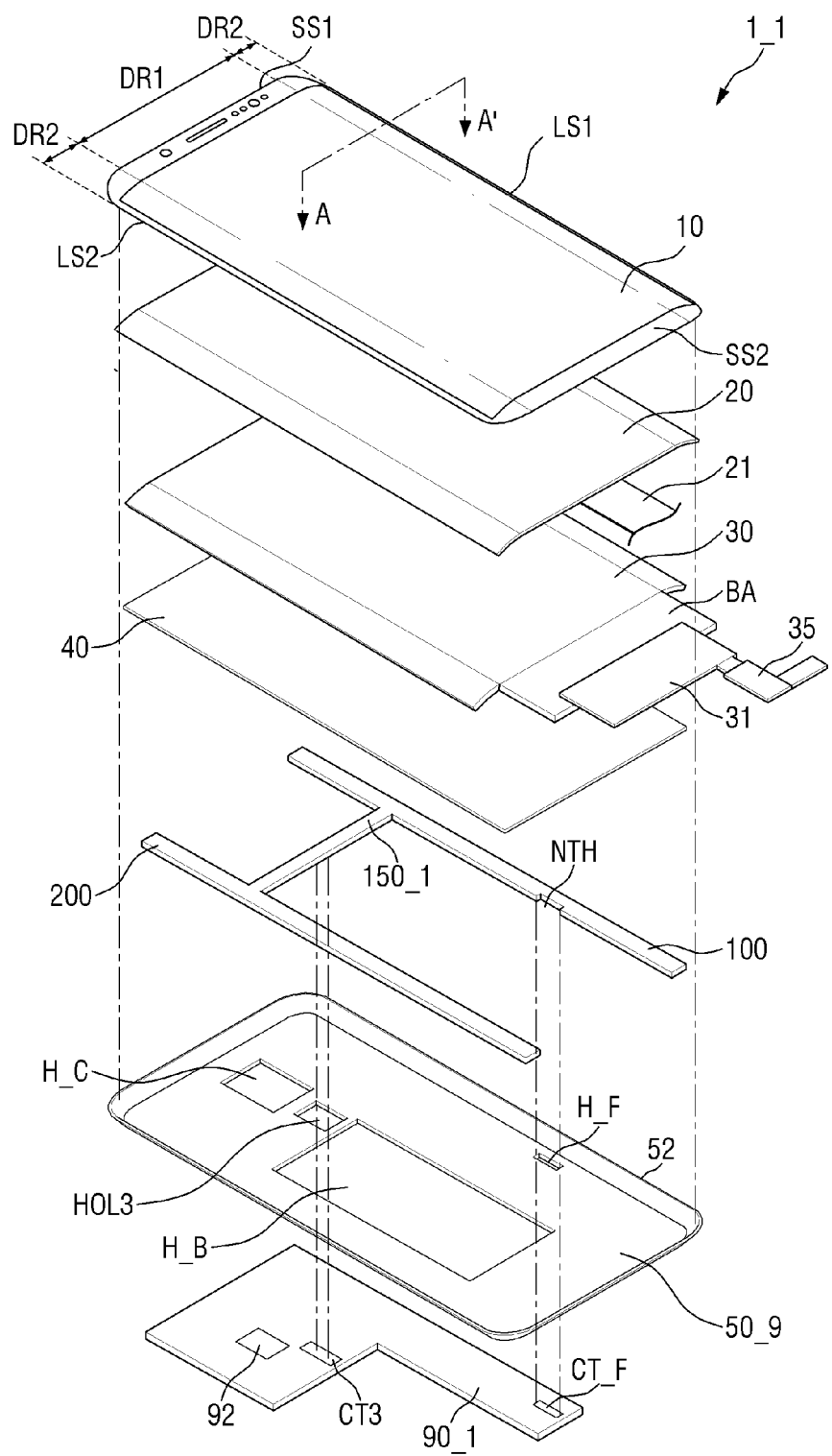
FIG. 24 is an exploded perspective view of another example of the display device of FIG. 1 according to some exemplary embodiments.

FIG. 24 is an exploded perspective view of another example of the display device of FIG. 1 according to some exemplary embodiments.

Referring to FIGS. 1, 2, and 24, a display device 1_1 is different from the display device 1 of FIG. 2 in that it includes a sensing flexible circuit board 150_1, a bracket 50_9, and a main circuit board 90_1.

The sensing flexible circuit board 150_1 may include a first connector, which connects a first force sensor 100 and a second force sensor 200 and overlaps a third hole HOL3 in bracket 50_9. The bracket 50_9 may include the third hole HOL3 disposed between a camera hole H_C and a battery hole H_B. The main circuit board 90_1 may include a third connector CT3 formed to overlap the third hole HOL3. In this manner, the first force sensor 100 and the second force sensor 200 may be connected to the main circuit board 90_1 by one sensing flexible circuit board 150_1 passing through the third hole HOL3.

Figure 25:
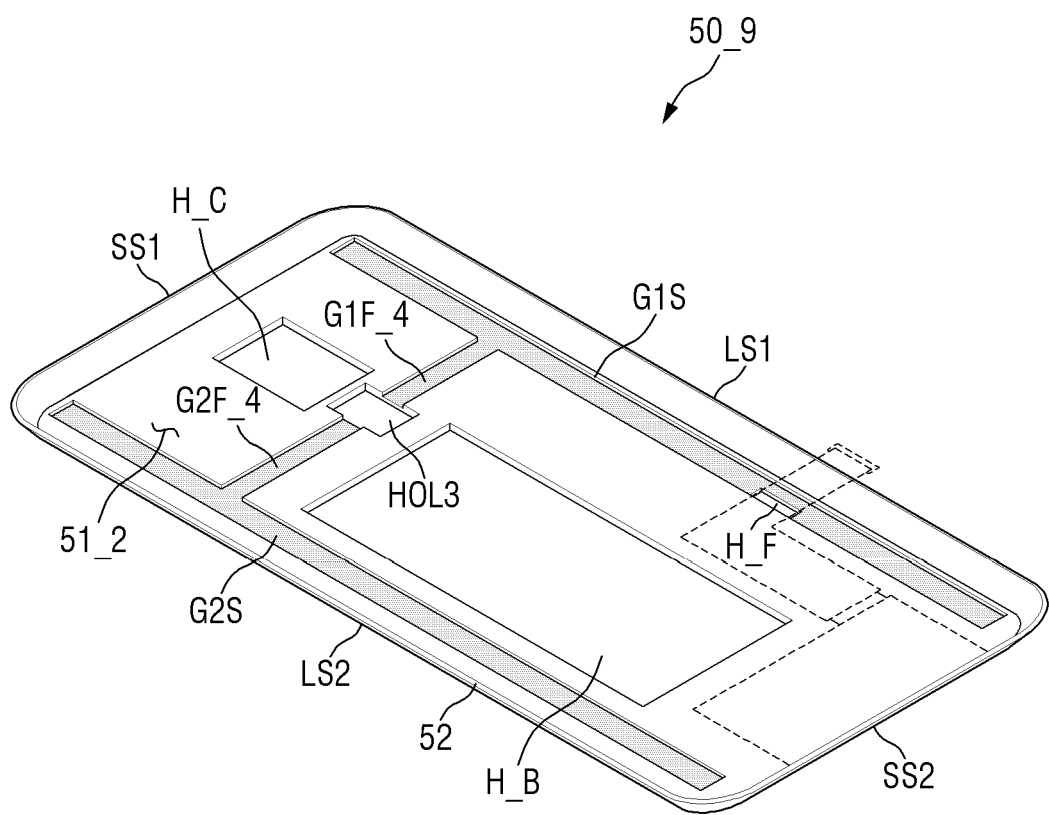
FIG. 25 is a perspective view of an example of a bracket included in the display device of FIG. 24 according to some exemplary embodiments.

FIG. 25 is a perspective view of an example of a bracket included in the display device of FIG. 24 according to some exemplary embodiments.

Referring to FIGS. 11 and 25, a bracket 50_9 is different from the bracket 50 of FIG. 11 in that it includes a third hole HOL3 instead of the first hole HOL1 and the second hole HOL2. The third hole HOL3 is, except for its size and position, substantially the same as or similar to the first hole HOL1 described above with reference to FIG. 11, and thus, a redundant description will not be repeated.

In FIG. 25, the bracket 50_9 includes first and second guide grooves G1F_4 and G2F_4 and first and second fixing grooves G1S_4 and G2S_4. The first and second guide grooves G1F_4 and G2F_4 and first and second fixing grooves G1S_4 and G2S_4 may each be longer than the first and second guide grooves G1F and G2F and first and second fixing grooves G1S and G2S of the bracket 50 in FIG. 11. However, exemplary embodiments are not limited to this case. For example, the configurations of the brackets 50_4 through 50_8 described above with reference to FIGS. 16 through 21 may also be applied to the bracket 50_9. In addition, in FIG. 25, the third hole HOL3 is disposed between a camera hole H_C and a battery hole H_B. However, this is merely an example, and exemplary embodiments are not limited to this example.

Figure 26:
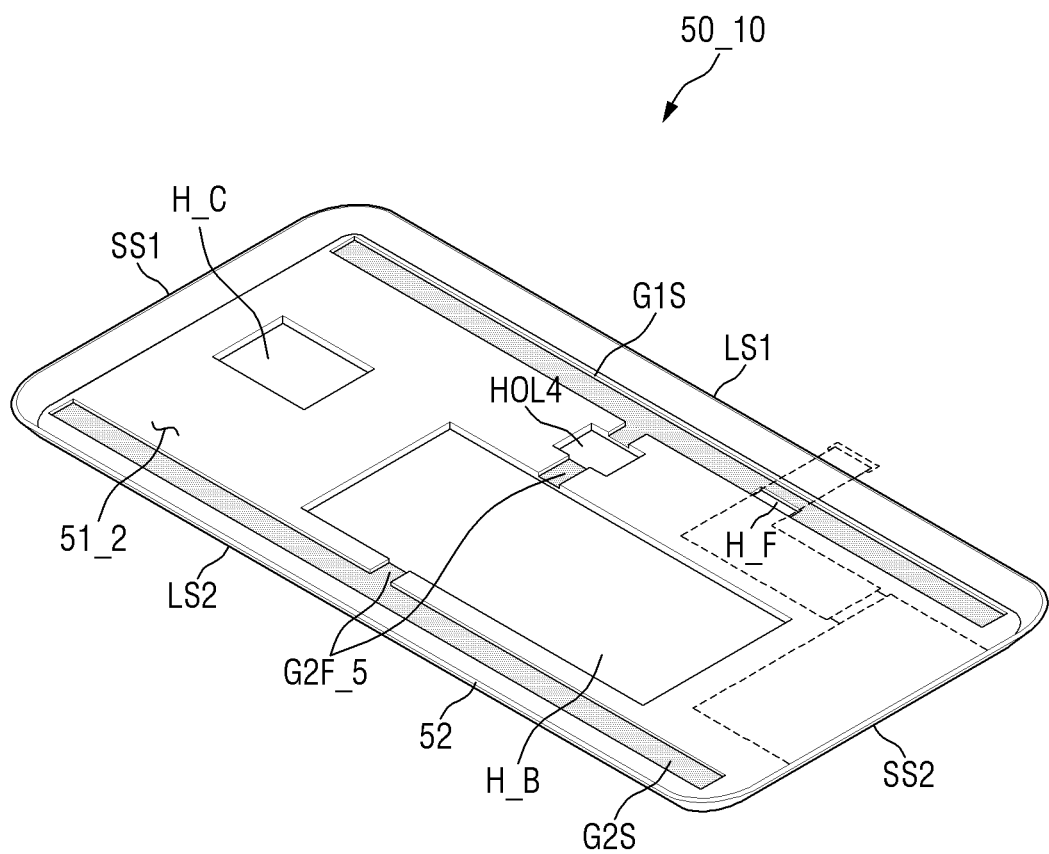
FIG. 26 is a perspective view of another example of the bracket included in the display device of FIG. 24 according to some exemplary embodiments.

FIG. 26 is a perspective view of another example of the bracket included in the display device of FIG. 24 according to some exemplary embodiments.

Referring to FIGS. 25 and 26, a bracket 50_10 is different from the bracket 50_9 of FIG. 25 in that it includes a fourth hole HOL4 instead of the third hole HOL3. The fourth hole HOL4 may be disposed between a battery hole H_B and a first long side LS1. In this case, a second guide groove G2F_5 may be formed discontinuously due to the battery hole H_B. This, however, is merely an example, and exemplary embodiments are not limited thereto. For instance, the second guide groove G2F_5 may extend along an edge of the battery hole H_B to be connected to a second fixing groove G2S.

Figure 27:
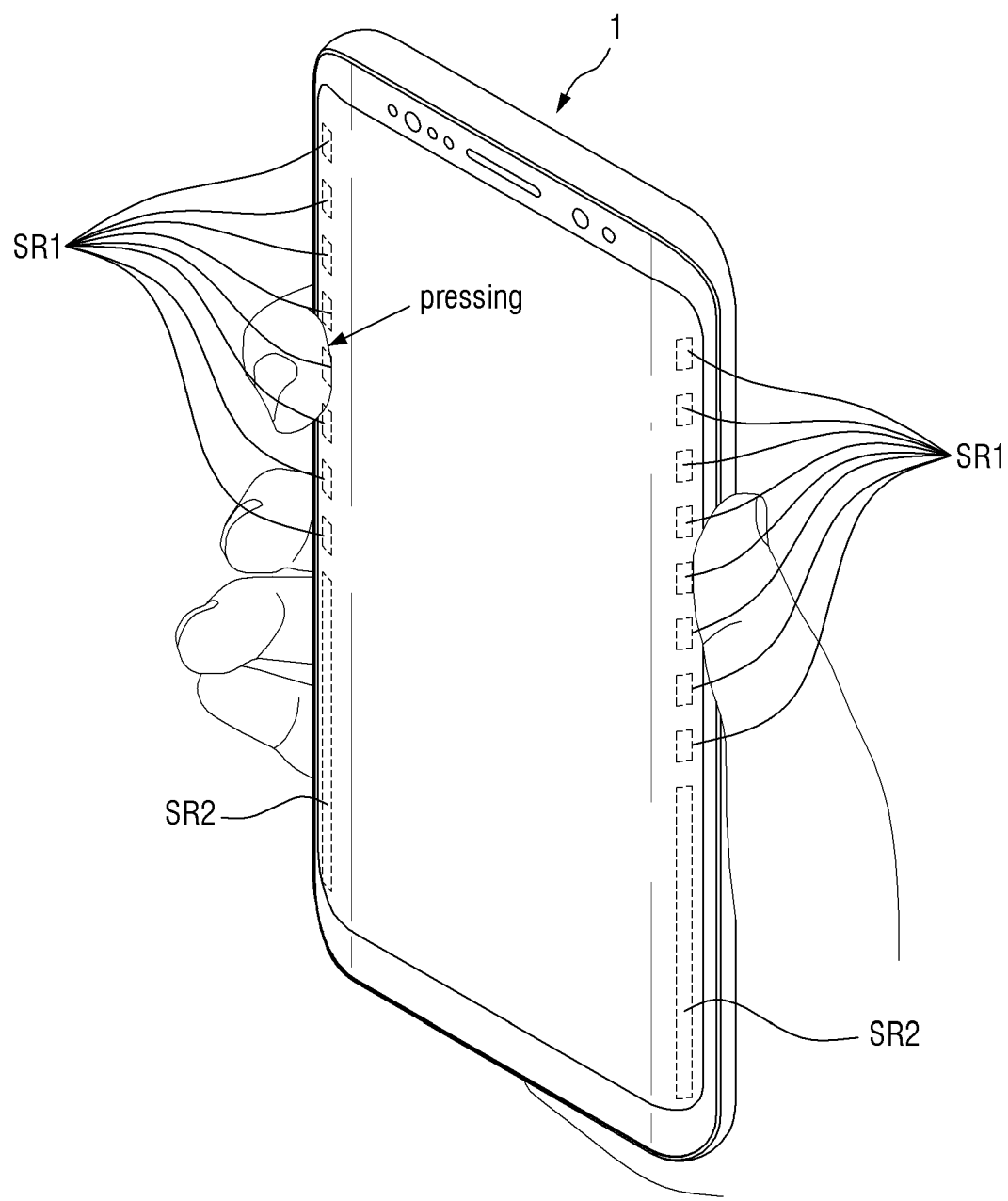
FIGS. 27 and 28 are diagrams illustrating a method of transmitting a force signal to the display device of FIG. 1 according to some exemplary embodiments.
Figure 28:
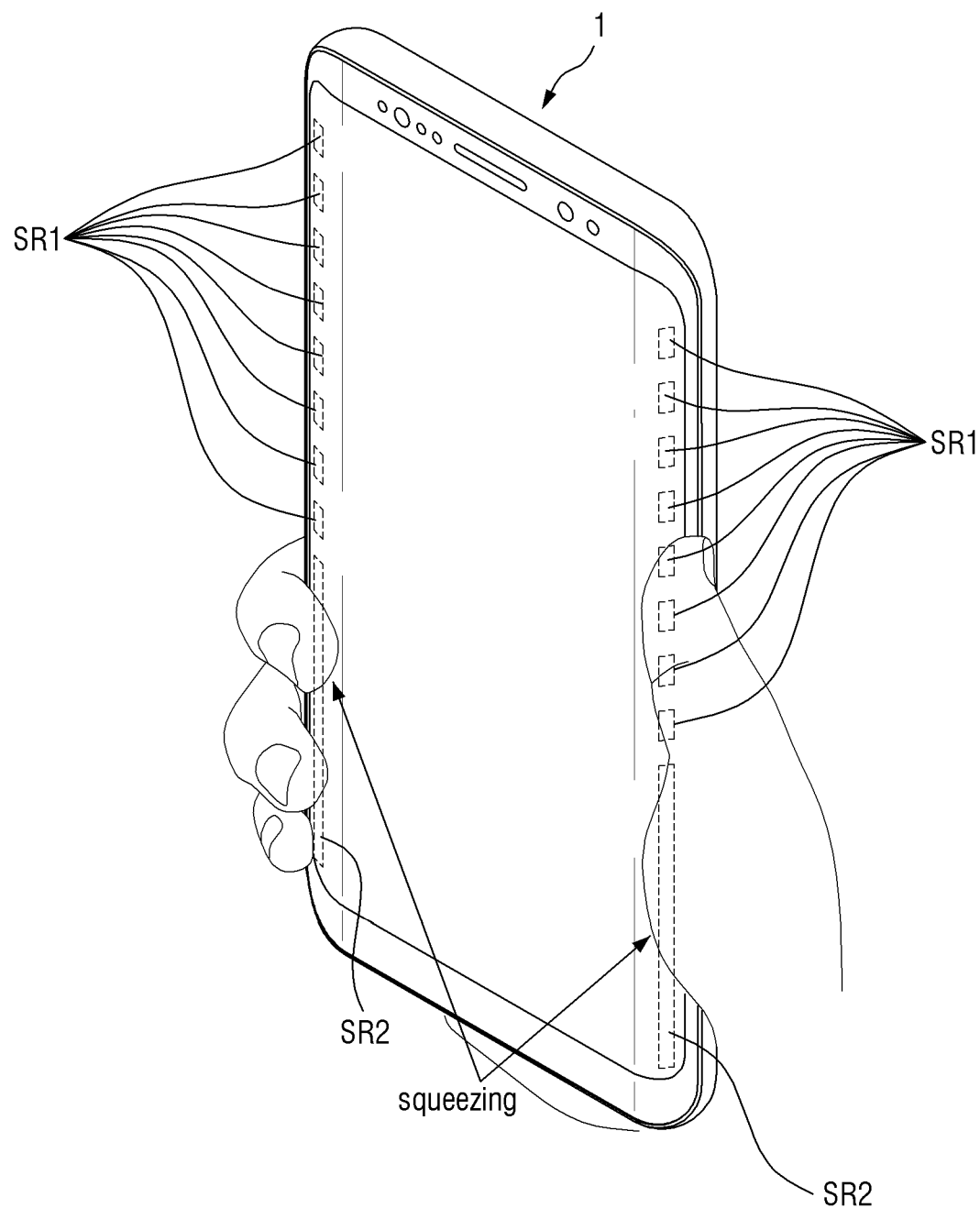

FIGS. 27 and 28 are diagrams illustrating a method of transmitting a force signal to the display device of FIG. 1 according to some exemplary embodiments.

In FIGS. 27 and 28, the display device 1 applied as a smartphone is illustrated as an example, but exemplary embodiments are not limited thereto. In the display device 1, physical input buttons on the long sides are omitted, and force sensors are disposed at corresponding positions in place of the physical input buttons.

Referring to FIG. 27, the display device 1 may include sensing regions SR1 and SR2. The sensing regions SR1 and SR2 may be included in the first force sensor 100 (see FIG. 2) and the second force sensor 200 (see FIG. 2), respectively. The sensing regions SR1 and SR2 are regions capable of sensing forces. The sensing regions SR1 and SR2 may sense forces at their corresponding positions independently of each other.

The sensing regions SR1 and SR2 may be arranged in the longitudinal direction of the display device 1. In some exemplary embodiments, the sensing regions SR1 and SR2 may be arranged in a column on each long side. Neighboring sensing regions SR1 and SR2 may be arranged continuously. Alternatively, the neighboring sensing regions SR1 and SR2 may be spaced apart from each other. That is, a non-sensing region may be disposed between the sensing regions SR1 and SR2.

In FIG. 27, a case where the first sensing regions SR1 are used as pressing recognition regions is illustrated. That is, in FIG. 27, a user is pressing a specific position with an index finger while gripping the display device 1 with other fingers. At the specific position, a first sensing region SR1 of the first or second force sensor 100 or 200 is disposed. When the first sensing region SR1 receives a force, the resistance of the force sensing layer 122 described with reference to FIG. 5 is changed, and whether the force has been applied to the specific position and the magnitude of the force may be identified based on the change in the resistance. Then, a preprogrammed operation of the display device 1 may be output according to the force and/or the magnitude of the force applied to the specific position. For example, a preprogrammed function, such as screen adjustment, screen lock, screen conversion, application calling, application execution, picture taking, telephone reception, etc., may be performed. Different operations may be preprogrammed for different first sensing regions SR1. Therefore, as the number of the first sensing regions SR1 increases, the display device 1 can easily produce more various inputs and/or outputs.

In FIG. 28, a case where the second sensing regions SR2 are used as squeezing recognition regions is illustrated. That is, in FIG. 28, the user is squeezing a relatively large area using the palm and fingers while gripping the display device 1 with the fingers. The second sensing regions SR2 are disposed in the area where the squeezing is performed to sense whether a force has been applied by the squeezing, as well as the magnitude of the force. Thus, a preprogrammed operation of the display device 1 may be performed according to the sensing result of the squeezing operation.

The user may perform the squeezing operation by naturally applying force to the entire hand while gripping the display device 1. Since the user can quickly perform the squeezing operation without an elaborate movement of the hand while gripping the display device 1, a simpler and quicker input is possible. Therefore, the second sensing regions SR2 can be used as an input medium for a frequently used function or a program requiring rapidity, such as snap shooting.

According to various exemplary embodiments, a display device may include force sensors disposed adjacent to edges of a display panel and a main circuit board connected to the force sensors so as to sense force, thereby providing an easy input method.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
a bracket;
a display panel disposed on the bracket;
a first force sensor disposed between the display panel and the bracket, the first force sensor being adjacent to a first edge of the display panel; and
a main circuit board disposed below the bracket such that the bracket is disposed between the display panel and the main circuit board,
wherein the bracket comprises a first hole exposing the main circuit board and being disposed between the display panel and the main circuit board, the first force sensor being connected to the main circuit board through the first hole.

2. The display device of claim 1, wherein the display panel comprises:
a flat portion; and
a first curved portion connected to a side of the flat portion, the first force sensor overlapping the first curved portion.

3. The display device of claim 1, further comprising:
a second force sensor disposed adjacent to a second edge of the display panel,
wherein the bracket further comprises a second hole exposing the main circuit board, the second force sensor being connected to the main circuit board through the second hole.

4. The display device of claim 1, further comprising:
a first sensing flexible circuit board comprising an end connected to the first force sensor and another end connected to the main circuit board via the first hole,
wherein the bracket further comprises a first guide groove formed in an upper surface of the bracket, the first sensing flexible circuit board being disposed in the first guide groove.

5. The display device of claim 4, wherein the bracket further comprises:
a fixing groove formed in the upper surface, the first force sensor being disposed in the fixing groove.

6. The display device of claim 5, wherein a first depth of the fixing groove from the upper surface of the bracket is equal to a second depth of the first guide groove from the upper surface of the bracket.

7. The display device of claim 5, wherein a first depth of the fixing groove from the upper surface of the bracket is different from a second depth of the first guide groove from the upper surface of the bracket.

8. The display device of claim 4, wherein a depth of the first guide groove on a side adjacent to the first hole is different from the depth of the first guide groove on another side adjacent to the first force sensor.

9. The display device of claim 8, wherein the depth of the first guide groove increases toward the first hole and decreases toward the first force sensor.

10. The display device of claim 1, further comprising:
a display flexible circuit board coupled to the display panel and disposed between the display panel and the bracket,
wherein the bracket further comprises a connect hole that, in a view normal to the display panel, is spaced apart from the main circuit board, an end of the display flexible circuit board being coupled to a lower surface of the main circuit board through the connect hole, and
wherein the lower surface of the main circuit board opposes an upper surface of the main circuit board facing the bracket.

11. The display device of claim 10, wherein the first force sensor extends along the first edge and comprises a recess at an inner long side adjacent to the connect hole.

12. The display device of claim 10, further comprising:
a first sensing flexible circuit board comprising an end coupled to the first force sensor and another end coupled to the upper surface of the main circuit board via the first hole.

13. The display device of claim 1, wherein:
the first force sensor comprises:
a first base;
a second base facing the first base;
a first electrode disposed on a surface of the first base, the surface of the first base facing the second base;
a second electrode disposed on the surface of the first base and separated from the first electrode; and
a force sensing layer disposed on a surface of the second base, the surface of the second base facing the first base; and
in response to a force being applied to the first edge of the display panel, the first electrode and the second electrode are configured to contact the force sensing layer.

14. The display device of claim 13, wherein:
the first force sensor comprises a first force sensing cell and a second force sensing cell configured to sense forces independently of each other;
the first electrode is disposed over the first force sensing cell and the second force sensing cell; and
the second electrode is disposed in each of the first force sensing cell and the second force sensing cell.

15. The display device of claim 13, wherein:
the first electrode comprises:
- a first stem electrode extending in a first direction; and
- a plurality of first branch electrodes branching from the first stem electrode; and the second electrode comprises:
- a second stem electrode facing the first stem electrode; and
- a plurality of second branch electrodes branching from the second stem electrode, the first branch electrodes and the second branch electrodes being alternately arranged between the first stem electrode and the second stem electrode.

16. The display device of claim 13, wherein:
the first force sensor further comprises a bump member disposed on another surface of the second base, the another surface opposing the surface of the second base; and
the bump member partially overlaps the force sensing layer.

17. A display device comprising:
a bracket;
a display panel disposed on the bracket;
a force sensor disposed between the display panel and the bracket, the force sensor being adjacent to an edge of the display panel;
a main circuit board disposed below the bracket such that the bracket is disposed between the display panel and the main circuit board;
a sensing flexible circuit board connecting the force sensor to a first connection terminal of the main circuit board via a hole in the bracket; and
a display flexible circuit board connecting the display panel to a second connection terminal of the main circuit board different from the first connection terminal.

18. The display device of claim 17, further comprising:
a first sensing flexible circuit board comprising an end connected to the first force sensor and another end connected to the main circuit board via the first hole; and
a first protective member disposed on the bracket, the first protective member covering the first hole and the first sensing flexible circuit board.

19. The display device of claim 18, further comprising:
a spacer member disposed between the first protective member and the display panel.

20. The display device of claim 18, further comprising:
a spacer member disposed along edges of the first protective member such that the spacer member is disposed between the bracket and the display panel.

21. A display device comprising:
a bracket;
a display panel disposed on the bracket;
a first force sensor disposed between the display panel and the bracket, the first force sensor being adjacent to a first edge of the display panel;
a second force sensor disposed adjacent to a second edge of the display panel;
a main circuit board disposed below the bracket such that the bracket is disposed between the display panel and the main circuit board,
wherein the bracket comprises a first hole exposing the main circuit board, each of the first force sensor and the second force sensor being connected to the main circuit board through the first hole.

22. The display device of claim 21, further comprising:
a sensing flexible circuit board connected to each of the first force sensor and the second force sensor, the sensing flexible circuit board being connected to the main circuit board through the first hole.

* * * * *